(12) United States Patent
Zhang et al.

(10) Patent No.: US 10,700,064 B1
(45) Date of Patent: Jun. 30, 2020

(54) MULTI-THRESHOLD VOLTAGE GATE-ALL-AROUND FIELD-EFFECT TRANSISTOR DEVICES WITH COMMON GATES

(71) Applicant: International Business Machines Corporation, Armonk, NY (US)

(72) Inventors: Jingyun Zhang, Albany, NY (US); Takashi Ando, Tuckahoe, NY (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/277,413

(22) Filed: Feb. 15, 2019

(51) Int. Cl.
| | |
|---|---|
| *H01L 29/49* | (2006.01) |
| *H01L 29/66* | (2006.01) |
| *H01L 29/78* | (2006.01) |
| *H01L 21/28* | (2006.01) |
| *H01L 27/088* | (2006.01) |
| *H01L 29/06* | (2006.01) |
| *H01L 21/8234* | (2006.01) |

(52) U.S. Cl.
CPC ...... *H01L 27/088* (2013.01); *H01L 21/28088* (2013.01); *H01L 21/823412* (2013.01); *H01L 21/823437* (2013.01); *H01L 21/823468* (2013.01); *H01L 29/0673* (2013.01); *H01L 29/4966* (2013.01); *H01L 29/6656* (2013.01); *H01L 29/66545* (2013.01); *H01L 29/78* (2013.01)

(58) Field of Classification Search
CPC ... H01L 29/06; H01L 29/067; H01L 29/0673; H01L 29/49; H01L 29/496; H01L 29/4966; H01L 29/66; H01L 29/665; H01L 29/6654; H01L 29/66545; H01L 29/6656; H01L 29/78; H01L 27/08; H01L 27/088; H01L 21/82; H01L 21/823; H01L 21/8234; H01L 21/82341; H01L 21/823412; H01L 21/82343; H01L 21/823437; H01L 21/82346; H01L 21/823468
USPC ........................................................ 257/368
See application file for complete search history.

(56) References Cited

U.S. PATENT DOCUMENTS

| | | |
|---|---|---|
| 8,658,518 B1 | 2/2014 | Chang et al. |
| 9,564,502 B2 | 2/2017 | Chang et al. |
| 9,685,564 B2 | 6/2017 | Sengupta et al. |
| 9,812,449 B2 | 11/2017 | Obradovic et al. |
| 9,985,141 B2 | 5/2018 | Lee et al. |
| 9,997,519 B1 | 6/2018 | Bao et al. |
| 10,026,652 B2 | 7/2018 | Wang et al. |

(Continued)

*Primary Examiner* — Monica D Harrison
(74) *Attorney, Agent, or Firm* — Vazken Alexanian; Ryan, Mason & Lewis, LLP

(57) ABSTRACT

Devices and methods are provided to fabricate multi-threshold voltage gate-all-around field-effect transistor devices (e.g., nanosheet field-effect transistor devices) wherein threshold voltage tuning is achieved by adjusting a channel spacing between active channel layers of the gate-all-around field-effect transistor devices in different device regions, and forming common high-k dielectric/metal gate structures for the gate-all-around field-effect transistor devices to achieve different thickness combinations of common work function metal layers in different channel spacings between active channel layers of the gate-all-around field-effect transistor devices.

20 Claims, 20 Drawing Sheets

(56) References Cited

U.S. PATENT DOCUMENTS 10,074,575 B1 * 9/2018 Guillorn ......... H01L 21/823878
2017/0256611 A1   9/2017 Kim et al.

* cited by examiner

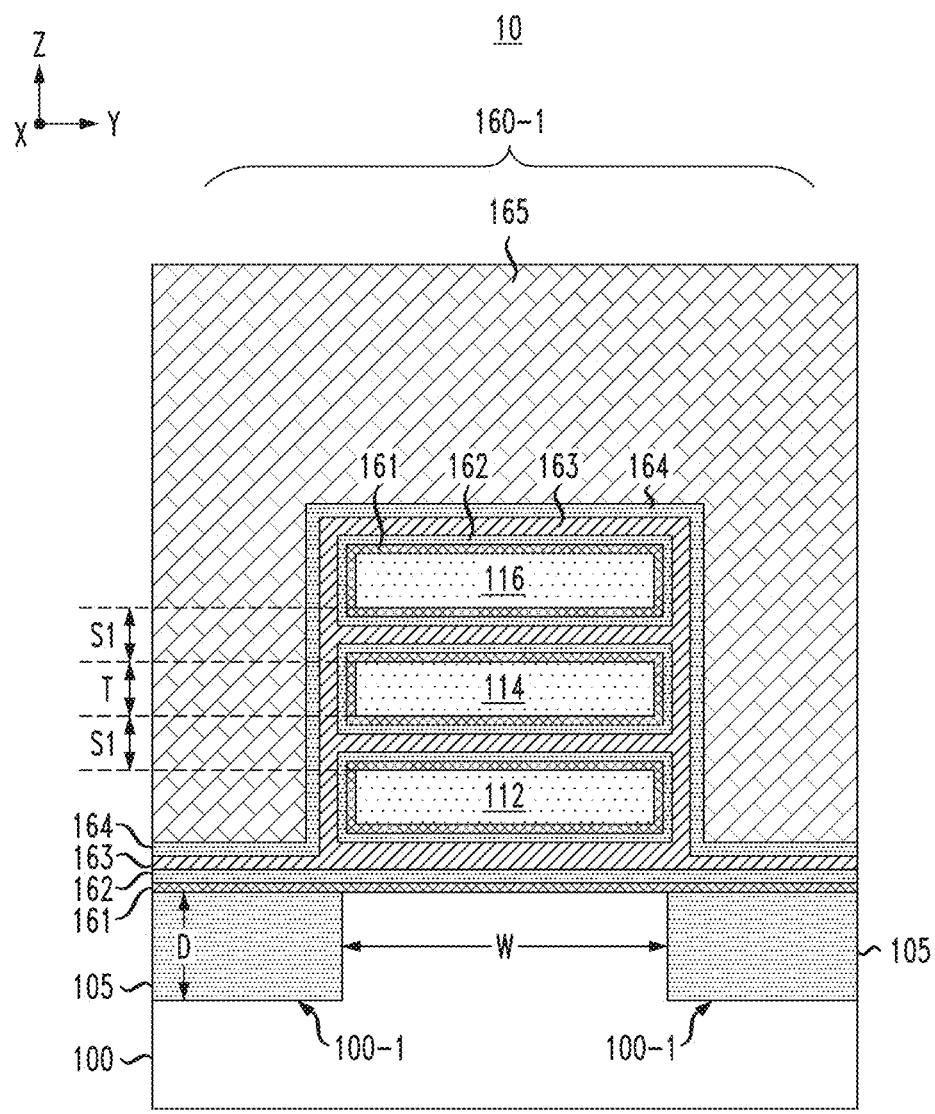

10

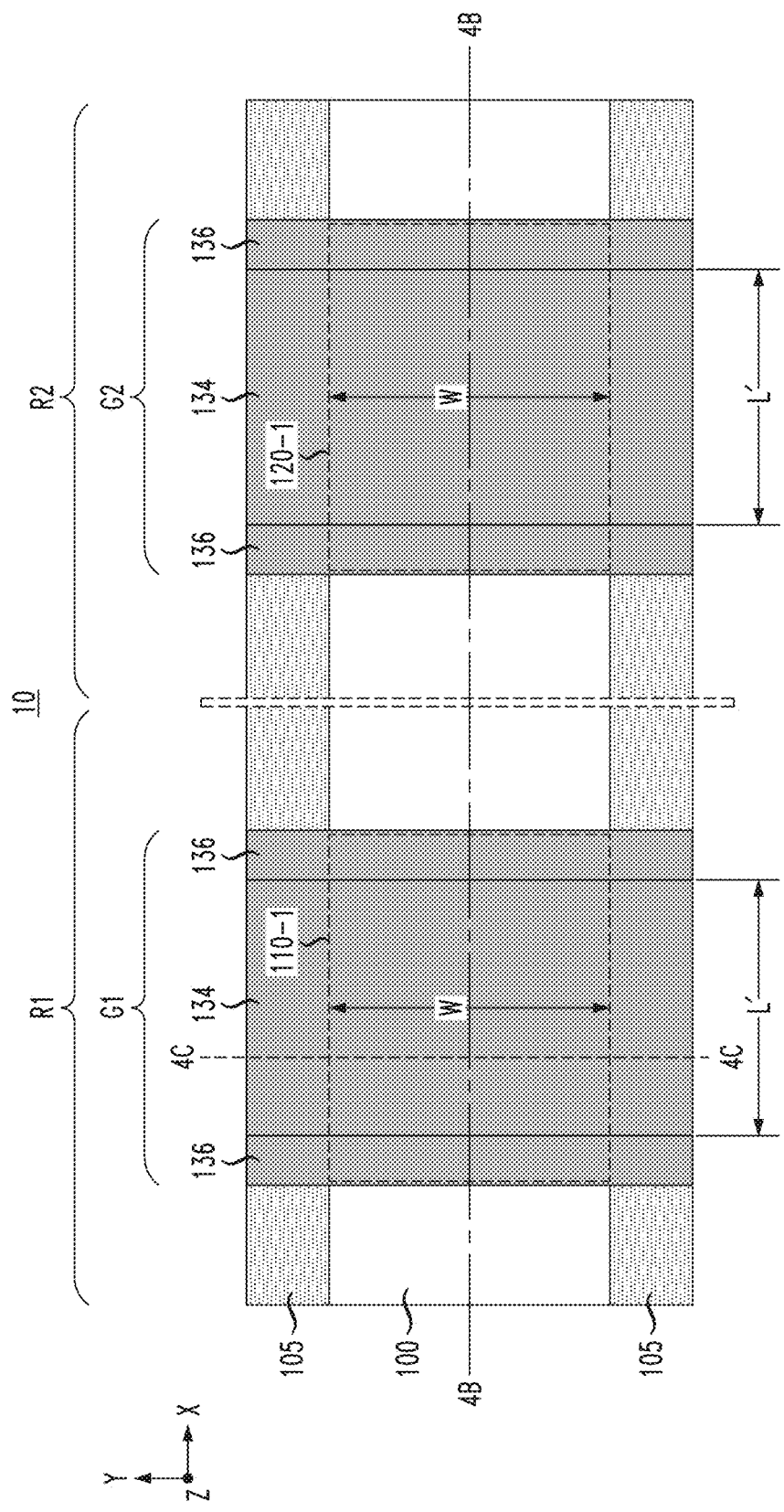

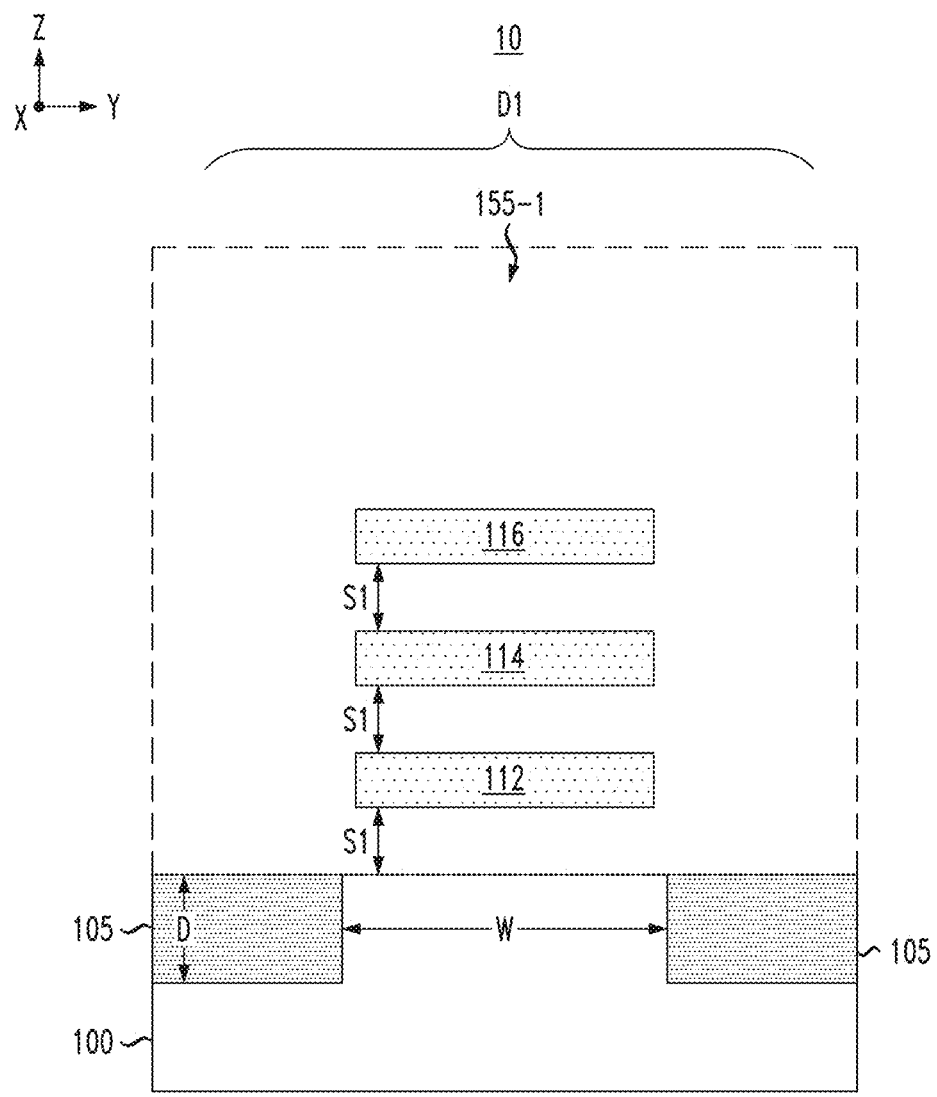

MULTI-THRESHOLD VOLTAGE GATE-ALL-AROUND FIELD-EFFECT TRANSISTOR DEVICES WITH COMMON GATES

TECHNICAL FIELD

This disclosure relates generally to semiconductor fabrication techniques and, in particular, to structures and methods for fabricating gate-all-around (GAA) field-effect transistor (FET) devices such as nanosheet FET devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In GAA FET devices such as vertical FETs and nanowire/nanosheet FET devices, the gate material is formed to surround all sides of the active channel layers of the FET devices. In addition, with nanowire/nanosheet FET devices, a common gate structure is formed above and below each nanowire/nanosheet layer in the stacked configuration, thereby increasing the FET device width (or channel width), and thus the drive current, for a given footprint area.

The threshold voltage (Vt) of a FET device is the voltage that is required to turn the transistor on. Multi-threshold voltage CMOS (MTCMOS) technologies implement methods for fabricating FET devices with multiple threshold voltages in order to optimize device performance (delay, power, etc.) for different applications. The threshold voltage of a FET device can be tuned using various techniques. For example, the threshold voltage of a FET device varies with gate dielectric thickness, wherein the threshold voltage decreases as the thickness of gate dielectric layer decreases. In addition, multi-Vt fabrication methods can tune the threshold voltages of non-planar FET devices by changing the thickness and/or material composition of work function metal (WFM) layers that are formed as part of high-k dielectric/metal gate (HKMG) structures for the non-planar FET devices such as nanosheet FET devices. The material composition of the work function metal layers can be modified through dopant implantation, or by forming multilayer WFM structures comprising stacks of two or more different types of work function metal layers.

The HKMG structures for p-type FET devices and n-type FET devices are typically formed with different WFM layers (one for p-FETs and one for n-FETs) as a way to optimize or otherwise tune the threshold voltages of the n-FETs and p-FETs, without the need for channel doping to achieve Vt tuning. In addition, the threshold voltages of n-type FET devices in different device regions can be tuned by using different metallic composition and/or layers for work function metal layers for the n-type FET devices. Similarly, the threshold voltages of p-type FET devices in different device regions can be tuned by using different metallic composition and/or layers for work function metal layers for the p-type FET devices. In this regard, WFM patterning methods are widely used in the semiconductor industry to fabricate FET devices with different work function metal layers so as to realize FET devices with multiple threshold voltages. However, the WFM patterning process can result in degraded gate stack quality due to, e.g., the formation of interfacial oxide layers (or increase the thickness of existing interfacial oxide layers) on active silicon channel layer of the FET devices as a result of etching environments used for the WFM patterning. The unwanted growth (or regrowth) of interfacial oxide layers on silicon channel layers of FET devices results in non-uniformity of the channel layers of the FET devices, as well as degraded device performance.

SUMMARY

Embodiments of the invention include methods for fabricating a semiconductor integrated circuit device comprising multi-threshold voltage gate-all-around field-effect transistor devices (e.g., nanosheet field-effect transistor devices) wherein threshold voltage tuning is achieved by adjusting a channel spacing between active channel layers of the gate-all-around FET devices in different device regions of the semiconductor integrated circuit device, and forming common high-k dielectric/metal gate structures for the gate-all-around field-effect transistor devices to achieve different thickness combinations of common work function metal layers in the different channel spacings between the active channel layers of the gate-all-around FET devices.

In one embodiment, a method for fabricating a semiconductor device, comprises: forming a first field-effect transistor device on a semiconductor substrate, wherein the first field-effect transistor device comprises (i) a plurality of first active channel layers that are separated by a first channel spacing and (ii) a first gate sidewall spacer which defines a first gate region of the first field-effect transistor device; forming a second field-effect transistor device on the semiconductor substrate, wherein the second field-effect transistor device comprises (i) a plurality of second active channel layers that are separated by a second channel spacing, wherein the second channel spacing is greater than the first channel spacing, and (ii) a second gate sidewall spacer which defines a second gate region of the second field-effect transistor device; and concurrently forming a first high-k dielectric/metal gate structure and a second high-k dielectric/metal gate structure within the first gate region and the second gate region, respectively. The first field-effect transistor device has a first threshold voltage as a result of the first high-k dielectric/metal gate structure formed around the first active channel layers that are separated by the first channel spacing. The second field-effect transistor device has a second threshold voltage, which is different from the first threshold voltage, as a result of the second high-k dielectric/metal gate structure formed around the second active channel layers that are separated by the second channel spacing.

In another embodiment, a method for fabricating a semiconductor device comprises: forming a first nanosheet stack structure of a first nanosheet field-effect transistor device on a semiconductor substrate, wherein the first nanosheet stack structure comprises a first stack of alternating semiconductor layers which comprises a plurality of first sacrificial nanosheet layers, and plurality of first active nanosheet channel layers, wherein each first active nanosheet channel layer is disposed between first sacrificial nanosheet layers in the first nanosheet stack structure, and wherein each first sacrificial nanosheet layer has a first thickness which defines a first channel spacing between the first active nanosheet channel layers of the first nanosheet stack structure; forming a second nanosheet stack structure of a second nanosheet field-effect transistor device on the semiconductor substrate, wherein the second nanosheet stack structure comprises a second stack of alternating semiconductor layers which comprises a plurality of second sacrificial nanosheet layers, and a plurality of second active nanosheet channel layers, wherein each second active nanosheet channel layer is disposed between second sacrificial nanosheet layers in the second nanosheet stack structure, and wherein each second sacrificial nanosheet layer has a second thickness which defines a second channel spacing between the second active nanosheet channel layers of the second nanosheet stack structure, wherein the second channel spacing is greater than the first channel spacing; forming first and second dummy gates over the first and second nanosheet stack structures, respectively, to define respective first and second gate regions; removing the first and second dummy gates to open the first and second gate regions and expose portions of the first and second nanosheet stack structures within the first and second gate regions; removing the first and second sacrificial nanosheet layers exposed in the first and second gate regions to release the first and second active nanosheet channel layers of the first and second nanosheet stack structures and form spaces between the first active nanosheet channel layers with the first channel spacing and form spaces between the second active nanosheet channel layers with the second channel spacing; and concurrently forming a first high-k dielectric/metal gate structure and a second high-k dielectric/metal gate structure within the first gate region and the second gate region, respectively. The first nanosheet field-effect transistor device has a first threshold voltage as a result of the first high-k dielectric/metal gate structure formed around the first active channel layers that are separated by the first channel spacing. The second nanosheet field-effect transistor device has a second threshold voltage, which is different from the first threshold voltage, as a result of the second high-k dielectric/metal gate structure formed around the second active channel layers that are separated by the second channel spacing.

Another embodiment includes a semiconductor integrated circuit device. The semiconductor integrated circuit device comprises: a first field-effect transistor device disposed on a semiconductor substrate, wherein the first field-effect transistor device comprises (i) a plurality of first active channel layers that are separated by a first channel spacing and (ii) a first gate sidewall spacer which defines a first gate region of the first field-effect transistor device; a second field-effect transistor device disposed on the semiconductor substrate, wherein the second field-effect transistor device comprises (i) a plurality of second active channel layers that are separated by a second channel spacing, wherein the second channel spacing is greater than the first channel spacing, and (ii) a second gate sidewall spacer which defines a second gate region of the second field-effect transistor device; and common first and second high-k dielectric/metal gate structures disposed within the first and second gate regions, respectively, of the first and second field-effect transistor devices. The first field-effect transistor device has a first threshold voltage as a result of the first high-k dielectric/metal gate structure formed around the first active channel layers that are separated by the first channel spacing, and the second field-effect transistor device has a second threshold voltage, which is different from the first threshold voltage, as a result of the second high-k dielectric/metal gate structure formed around the second active channel layers that are separated by the second channel spacing.

Other embodiments will be described in the following detailed description of embodiments, which is to be read in conjunction with the accompanying figures.

BRIEF DESCRIPTION OF THE DRAWINGS

FIGS. 1A, 1B, 1C, and 1D are schematic views of a semiconductor integrated circuit device comprising a plurality of nanosheet FET devices that are fabricated to have different threshold voltages across different device regions of the semiconductor integrated circuit device, according to an embodiment of the invention, wherein:

FIG. 1A is a schematic cross-sectional side view showing a first nanosheet FET device and a second nanosheet FET device disposed in different device regions of the semiconductor integrated circuit device;

FIG. 1B is a schematic cross-sectional side view showing a third nanosheet FET device and a fourth nanosheet FET device disposed in different device regions of the semiconductor integrated circuit device;

FIG. 1C is a schematic cross-sectional side view of the first nanosheet device of the semiconductor integrated circuit device along line 1C-1C in FIG. 1A; and FIG. 1D is a schematic cross-sectional side view of the second nanosheet device of the semiconductor integrated circuit device along line 1D-1D in FIG. 1A.

FIGS. 2-9 schematically illustrate a method for fabricating a semiconductor integrated circuit device comprising a plurality of nanosheet FET devices having different threshold voltages across different device regions of the semiconductor integrated circuit device, according to an embodiment of the invention, wherein:

FIG. 2 is a schematic cross-sectional side view of the semiconductor device at initial stage of fabrication comprising a semiconductor substrate, and a first nanosheet stack structure and a second nanosheet stack structure formed on the semiconductor substrate;

FIG. 3 is a schematic top plan view of the semiconductor device structure of FIG. 2 after patterning the first and second nanosheet stack structures to form elongated nanosheet stack structures, and after forming a shallow trench isolation layer surrounding the first and second elongated nanosheet stack structures;

FIG. 4A is a schematic top plan view of the semiconductor device structure of FIG. 3 after forming first and second gate structures over the first and second elongated nanosheet stack structures, and further patterning the first and second elongated nanosheet stack structures to form the individual first and second nanosheet stack structures for the first and second nanosheet FET devices;

FIG. 5 is a schematic cross-sectional side view of the semiconductor device structure shown in FIG. 4B after forming inner spacers for the first and second gate structures, after forming epitaxial source/drain layers for the first and second nanosheet FET devices, and after forming an interlayer dielectric layer;

FIG. 6C is a schematic cross-sectional side view of the semiconductor device structure along line 6C-6C shown in FIG. 6A;

FIG. 7 is a schematic cross-sectional side view of the semiconductor device structure shown in FIG. 6B after forming a high-k gate dielectric layer and a first work function metal layer which conformally covers exposed silicon surfaces of the active nanosheet channel layers within the open gate regions of the first and second gate structures;

FIG. 9 is a schematic cross-sectional side view of the semiconductor device structure shown in FIG. 8A after forming a third work function metal layer which conformally covers the second work function metal layer within the open gate regions of the first and second gate structures and which fills remaining portions of channel spaces between the active nanosheet channel layers of the second nanosheet FET device.

DETAILED DESCRIPTION

Figure 1A:
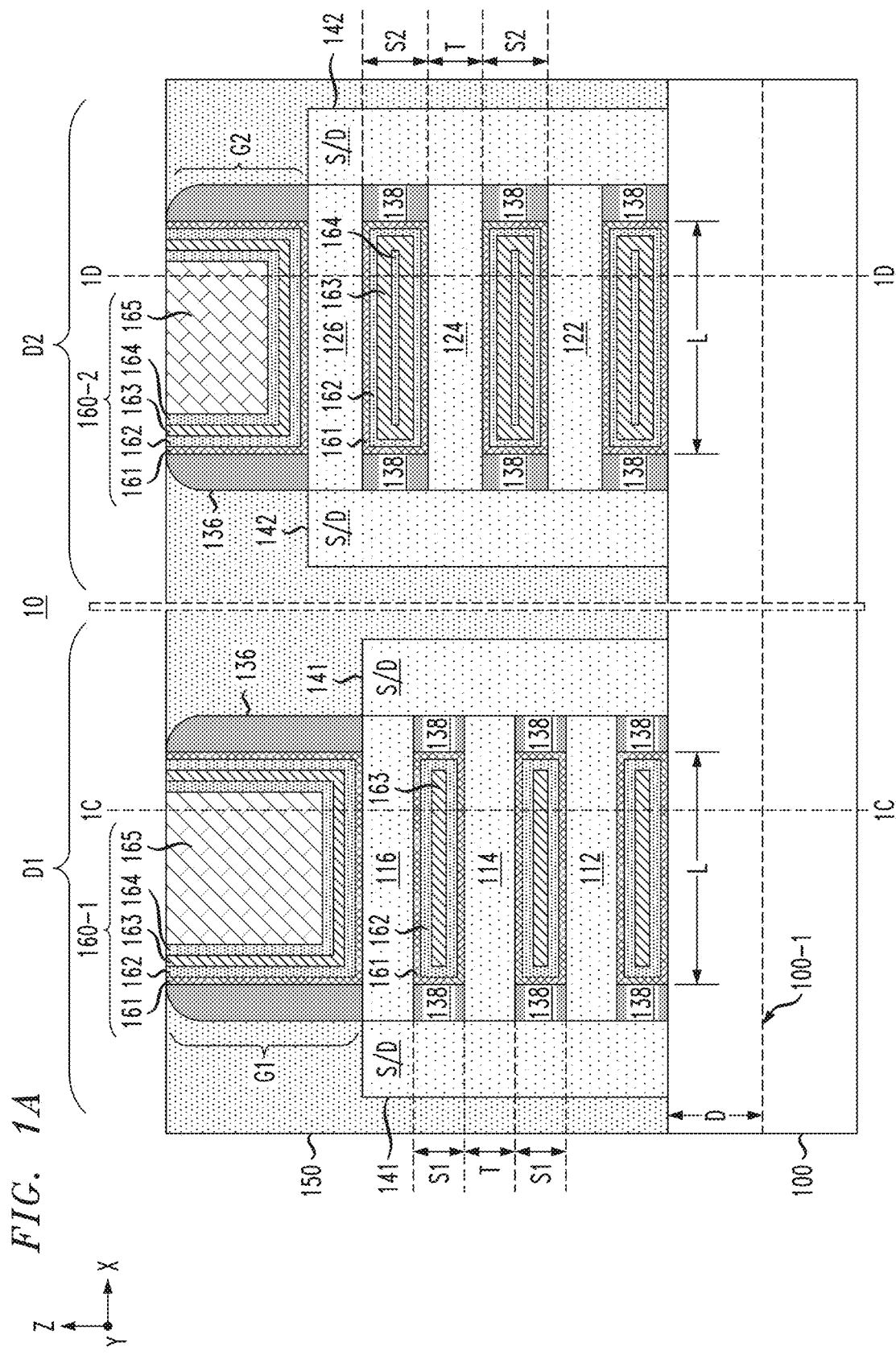

Embodiments of the invention will now be described in further detail with regard to devices and methods for fabricating a semiconductor integrated circuit device comprising multi-threshold voltage gate-all-around FET devices (e.g., nanosheet FET devices) wherein threshold voltage tuning is achieved by adjusting a channel spacing between active channel layers of the gate-all-around FET devices in different device regions of the semiconductor integrated circuit device, and forming common HKMG structures for the gate-all-around FET devices to achieve different thickness combinations of common work function metal layers in the different channel spacings between the active channel layers of the gate-all-around FET devices. The exemplary devices and methods described herein allow for multi-Vt tuning of n-type and p-type gate-all-around FET devices by modulating channel spacing, while fabricating common gate structures (e.g., gate structures concurrently formed using the same work function metals and deposition processes) and thus eliminate the need for utilizing WFM patterning methods to fabricate multi-Vt FET devices with different work function metal layers. For illustrative purposes, exemplary embodiments of the invention will be discussed in the context of nanosheet FET devices, but it is to be understood that the multi-Vt FET fabrication techniques discussed herein are readily applicable to various types of gate-all-around FET devices such as vertical fin-type FETs, nanowire FETs, and any type of FET device which comprises active channel layers with gate structures that are formed around all sides of the active channel layers.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
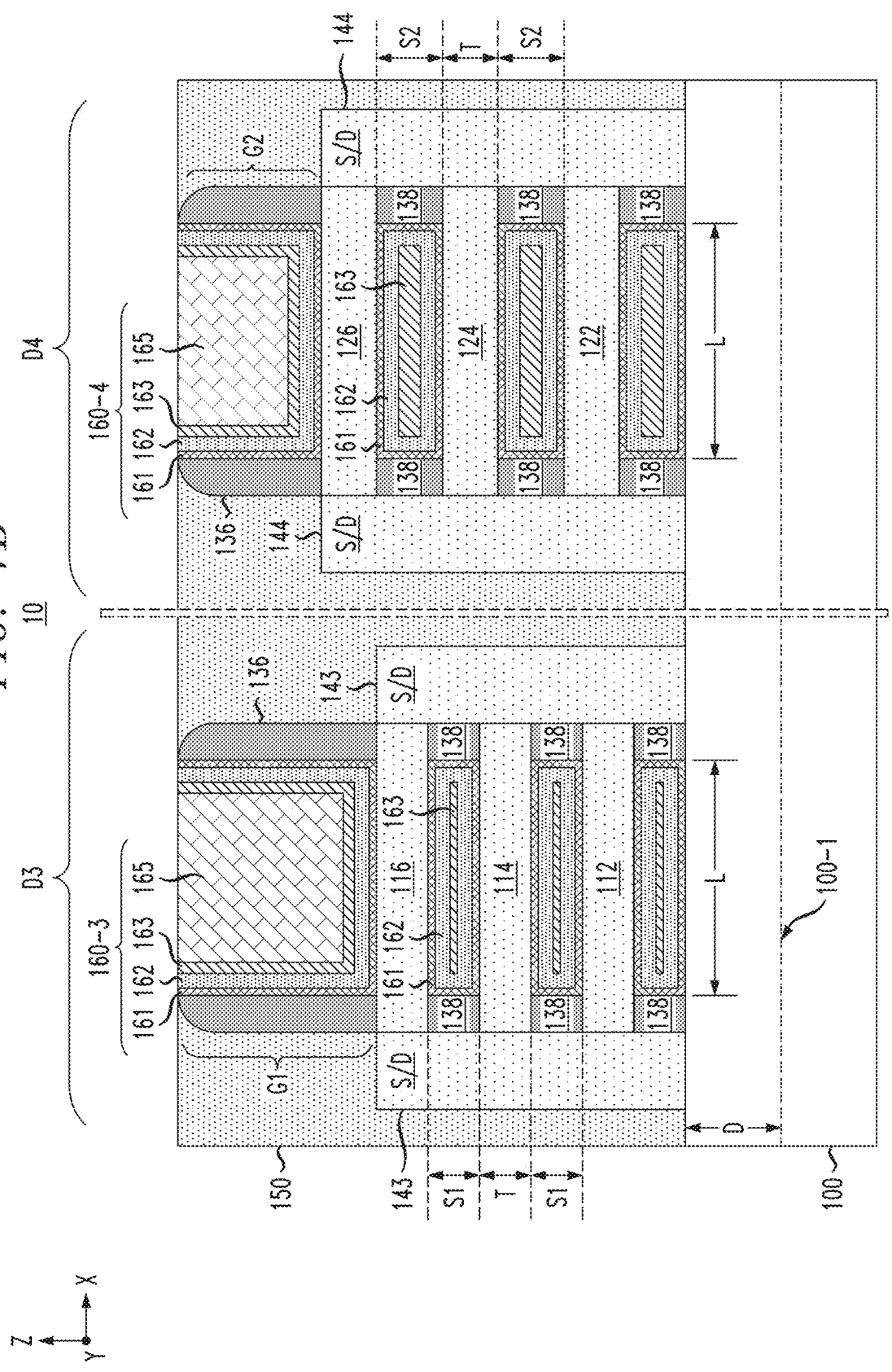
Figure 1D:
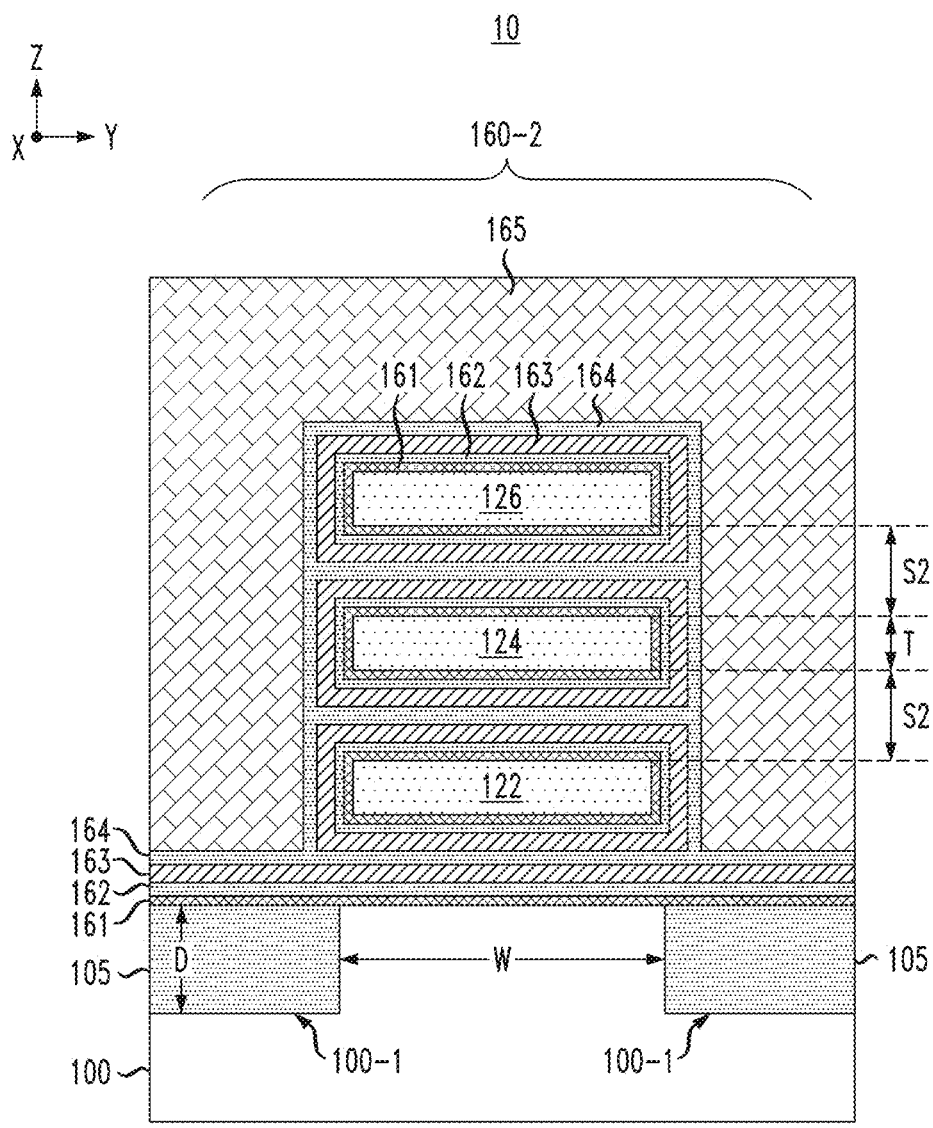

FIGS. 1A, 1B, 1C, and 1D are schematic views of a semiconductor integrated circuit device 10 comprising a plurality of nanosheet FET devices that are fabricated to have different threshold voltages across different device regions of the semiconductor integrated circuit device 10, according to an embodiment of the invention. More specifically, FIG. 1A is a schematic cross-sectional side view (X-Z plane) showing a first nanosheet FET device D1 and a second nanosheet FET device D2 disposed in different device regions of the semiconductor integrated circuit device 10. FIG. 1B is a schematic cross-sectional side view (X-Z plane) showing a third nanosheet FET device D3 and a fourth nanosheet FET device D4 disposed in different device regions of the semiconductor integrated circuit device 10. FIG. 1C is a schematic cross-sectional side view (Y-Z plane) of the first nanosheet device D1 of the semiconductor integrated circuit device 10 along line 1C-1C in FIG. 1A. FIG. 1D is a schematic cross-sectional side view (Y-Z plane) of the second nanosheet device D2 of the semiconductor integrated circuit device 10 along line 1D-1D in FIG. 1A. As explained in further detail below, FIGS. 1A, 1B, 1C and 1D illustrate an exemplary embodiment in which the nanosheet FET devices D1, D2, D3 and D4 are structured to have different threshold voltages by modulating the channel spacing between active channel layers of the nanosheet FET devices in the different device regions, and forming common gate structures using the same work function metal layers but with different thickness combinations of the same work function metal layers in the different channel spacings.

As illustrated in FIGS. 1A, 1B, 1C, and 1D, the semiconductor integrated circuit device 10 comprises a semiconductor substrate 100, a shallow trench isolation layer 105 disposed within a trench 100-1 formed in semiconductor substrate 100. The first and third nanosheet FET devices D1 and D3 each comprise a nanosheet stack structure comprising a plurality of active nanosheet channel layers 112, 114, and 116, and the second and fourth nanosheet FET devices D2 and D4 each comprise a nanosheet stack structure comprising a plurality of active nanosheet channel layers 122, 124, and 126. In one embodiment, the active nanosheet channel layers 112, 114, 116, 122, 124 and 126 are formed of epitaxial semiconductor material such as epitaxial silicon and have a same thickness T. The active nanosheet channel layers 112, 114, and 116 of the first and third nanosheet FET devices D1 and D3 are separated by a first channel spacing S1, and the active nanosheet channel layers 122, 124, and 126 of the second and fourth nanosheet FET devices D2 and D4 are separated by a second channel spacing S2, wherein the spacing S2 is greater than the spacing S1.

The nanosheet FET devices D1, D2, D3, and D4 comprise respective epitaxial source/drain (S/D) layers 141, 142, 143 and 144 which are connected to end portions of the active nanosheet channel layers along a channel length L of the nanosheet FET devices (wherein the channel length L is defined by the distance between the inner surfaces of the inner sidewall spacers 138, as schematically illustrated in FIGS. 1A and 1B). More specifically, in one embodiment, the source/drain layers 141 and 143 of the first and third nanosheet FET devices D1 and D3 comprise epitaxial semiconductor layers that are epitaxially grown on the end portions of the active nanosheet channel layers 112, 114, and 116, and the source/drain layers 142 and 144 of the second and fourth nanosheet devices D2 and D4 comprise epitaxial semiconductor layers that are epitaxially grown on the end portions of the active nanosheet channel layers 122, 124, and 126. It is to be understood that the term "source/drain region" as used herein means that a given source/drain region can be either a source region or a drain region, depending on the application or circuit configuration. The nanosheet FET devices D1, D2, D3, and D4 are encapsulated in an insulating layer 150 (e.g., an interlayer dielectric (ILD) layer or a PMD (pre-metal dielectric) layer) which is formed as part of a middle-of-the-line (MOL) layer of the semiconductor integrated circuit device 10.

The nanosheet FET devices D1, D2, D3 and D4 comprise respective first, second, third, and fourth gate structures G1, G2, G3 and G4 covering the respective nanosheet stack structures. The gate structures G1, G2, G3 and G4 each comprise a gate sidewall spacer 136 and inner sidewall spacers 138 which define gate regions of the gate structures G1, G2, G3, and G4. The gate structures G1, G2, G3 and G4 comprise high-k dielectric/metal gate (HKMG) structures 160-1, 160-2, 160-3 and 160-4, respectively, formed within the gate regions defined by the sidewall spacers 136 and 138 of the gate structures. As explained in further detail below, the HKMG structures are formed with common gate dielectric and work function materials, thereby eliminating the need to perform WFM patterning methods to achieve different threshold voltages.

In the exemplary embodiment shown in FIGS. 1A-1D, the HKMG structures 160-1, 160-2, 160-3 and 160-4 are formed with common gate dielectric and work function materials. In particular, the HKMG structures 160-1, 160-2, 160-3 and 160-4 each comprise a conformal layer of high-k gate dielectric material 161 disposed on surfaces the active nanosheet channel layers 112, 114, 116, 122, 124, and 126 within the gate regions of the gate structures G1, G2, G3, and G4. The high-k gate dielectric layers 161 are formed using any suitable high-k dielectric materials such as $HfO_2$, HfSiO, HfZrO, and nitrided films thereof. In some embodiments, a thin interfacial silicon oxide layer is formed on formed on the epitaxial silicon surfaces of the active nanosheet channel layers 112, 114, 116, 122, 123 and 126 prior to forming the conformal layers of high-k gate dielectric material 161.

In addition, the HKMG structures 160-1, 160-2, 160-3 and 160-4 comprise two or more of a first layer of work function metal 162, a second layer of work function metal 163, and a third layer of work function layer 164, which fills the gate regions including the spaces above and below the active nanosheet channel layers of the nanosheet FET devices D1, D2, D3 and D4. In an exemplary embodiment, the first and third work function metal layers 162 and 164 comprise titanium nitride (TiN), and the second work function metal layer 163 comprises an aluminum (Al) containing alloy material such as titanium aluminum carbide (TiAlC), TiAl, AlC, etc.) Moreover, the HKMG structures 160-1, 160-2, 160-3 and 160-4 each comprise a metallic gate electrode 165 (e.g., tungsten, cobalt, ruthenium, etc.).

In the exemplary embodiment of FIGS. 1A-1D, assuming that the nanosheet FET devices D1, D2, D3, and D4 are of the same type (e.g., N-type or P-type), each of the nanosheet FET devices D1, D2, D3, and D4 have a different threshold voltage (Vt) as a result of the two different channel spacings S1 and S2 and different thickness combinations of the work function metal layers 162, 163 and 164 that are disposed above and below the active channel layers. In particular, as shown in FIGS. 1A, 1C, and 1D, the HKMG structures 160-1 and 160-2 of the first and second nanosheet FET devices D1 and D2 each comprise the first work function metal layer 162 and the second work function metal layer 163 disposed within the spaces S1 and S2 between the active nanosheet channel layers 112, 114, 116, 122, 124, and 126. In addition, the HKMG structure 160-2 of the second nanosheet FET device D2 comprises the third work function metal layer 164 disposed in the spaces S2 between the active nanosheet channel layers 122, 124, and 126.

In this regard, FIGS. 1A, 1C and 1D illustrate an exemplary embodiment in which the first and second nanosheet devices D1 and D2 have common gate structures that are concurrently fabricated using the same materials and deposition processes, but resulting in two different WFM stacks as a result of the different channel spacings S1 and S2.

Indeed, as explained in further detail below, during fabrication of the HKMG structures 160-1 and 160-2, the deposition process for the second work function layer 163 results in "pinch off" of the smaller spacing S1 between the active nanosheet channel layers 112, 114, and 116 of the first nanosheet device D1, while no "pinch off" occurs in the larger spacing S2 between the active nanosheet channel layers 122, 124, and 126 of the second nanosheet device D2. As such, the deposition process for forming the third work function metal layer 164 fills in the remaining portions of the spaces S2 between the active nanosheet channel layers 122, 124, and 126 of the second nanosheet device D2.

Similarly, FIG. 1B illustrates an exemplary embodiment in which the third and fourth nanosheet devices D3 and D4 have common gate structures that are concurrently fabricated using the same materials and deposition processes, but resulting in two different WFM stacks as a result of the different channel spacings S1 and S2. In particular, as shown in FIG. 1B, the HKMG structures 160-3 and 160-4 of the third and fourth nanosheet FET devices D3 and D4 each comprise the first work function metal layer 162 and the second work function metal layer 163 disposed within the spaces S1 and S2 between the active nanosheet channel layers 112, 114, 116, 122, 124, and 126. As compared to the HKMG structures 160-1 and 160-2 of FIG. 1A, the first layer of work function metal 162 of the HKMG structures 160-3 and 160-4 is formed with a greater thickness, resulting in near pinch-off of the smaller spaces S1 between the active nanosheet channel layers 122, 124, and 126 of the third nanosheet device D3.

In addition, the deposition process for forming the second work function metal layer 163 results in pinch-off of the spaces S1 and S2 between the active nanosheet channel layers of the nanosheet FET devices D3 and D4. As a result, the WFM stacks of the nanosheet FET devices D3 and D4 each include the first and second layers of work function metal 162 and 163, but where the work function metal layer 163 of the HKMG structure 160-4 of the nanosheet FET device D4 is thicker than the work function metal layer 163 of the HKMG structure 160-3 of the nanosheet FET device D3.

The exemplary embodiment shown in FIGS. 1A and 1B results in four nanosheet FET devices D1, D2, D3 and D4 having different threshold voltages Vt1, Vt2, Vt3, and Vt4, respectively, which are obtained using two different channel spacings S1 and S2 and two separate WFM fabrication stages, but without the need to perform WFM patterning methods to remove and replace WFM stacks in any of the nanosheet FET devices. Assuming that the nanosheet FET devices D1, D2, D3 and D4 are N-type nanosheet FET devices, the exemplary HKMG structures 160-1, 160-2, 160-3 and 160-4 would result in Vt1<Vt2 and Vt4<Vt3, with Vt1<Vt2<Vt4<Vt3. Alternatively, assuming that the nanosheet FET devices D1, D2, D3 and D4 are P-type nanosheet FET devices, the exemplary HKMG structures 160-1, 160-2, 160-3 and 160-4 would result in Vt1>Vt2 and Vt3<Vt4.

Furthermore, it is to be noted that pairs of N-type and P-type nanosheet FET devices can be fabricated for each of the device structures of the nanosheet devices D1, D2, D3 and D4 shown in FIGS. 1A and 1B to obtain four pairs of different threshold voltages for N-type and P-type FET devices using two different channel spacings S1 and S2 and two separate WFM fabrication stages. For example, the same exemplary device structure and HKMG structures 160-1 for the nanosheet FET device D1 in FIG. 1A can be fabricated for both N-type and P-type nanosheet devices device, with a difference being the types of epitaxial materials used to form the source/drain structures 141. For example, for P-type devices, the source/drain structures 141 could be fabricated using SiGe epitaxial material, whereas for N-type devices the source/drain structures 141 could be fabricated with SiC epitaxial material. Similarly, the same exemplary device structures and HKMG structures 160-2, 160-3, and 160-4 for the nanosheet FET devices D2, D3 and D4 can be fabricated for both N-type and P-type nanosheet devices device, with a difference being the types of epitaxial materials used to form the source/drain structures 142, 143, and 144.

FIGS. 2-9 schematically illustrate a method for fabricating a semiconductor integrated circuit device comprising a plurality of nanosheet FET devices having different threshold voltages across different device regions R1 and R2 of the semiconductor integrated circuit device, according to an embodiment of the invention. For illustrative purposes, FIGS. 2-9 illustrate a process for fabricating the semiconductor integrated circuit device 10 of FIGS. 1A-1D. For ease of illustration and explanation, FIGS. 2-9 specifically illustrate a process flow for fabricating the device structures of the nanosheet FET devices D1 and D2 (shown in FIG. 1A) in respective device regions R1 and R2, but it is to be understood that the same or similar process flow is utilized to fabricate the device structures for the nanosheet FET devices D3 and D4 shown in FIG. 1B in other device regions of the semiconductor integrated circuit device 10.

Figure 2:
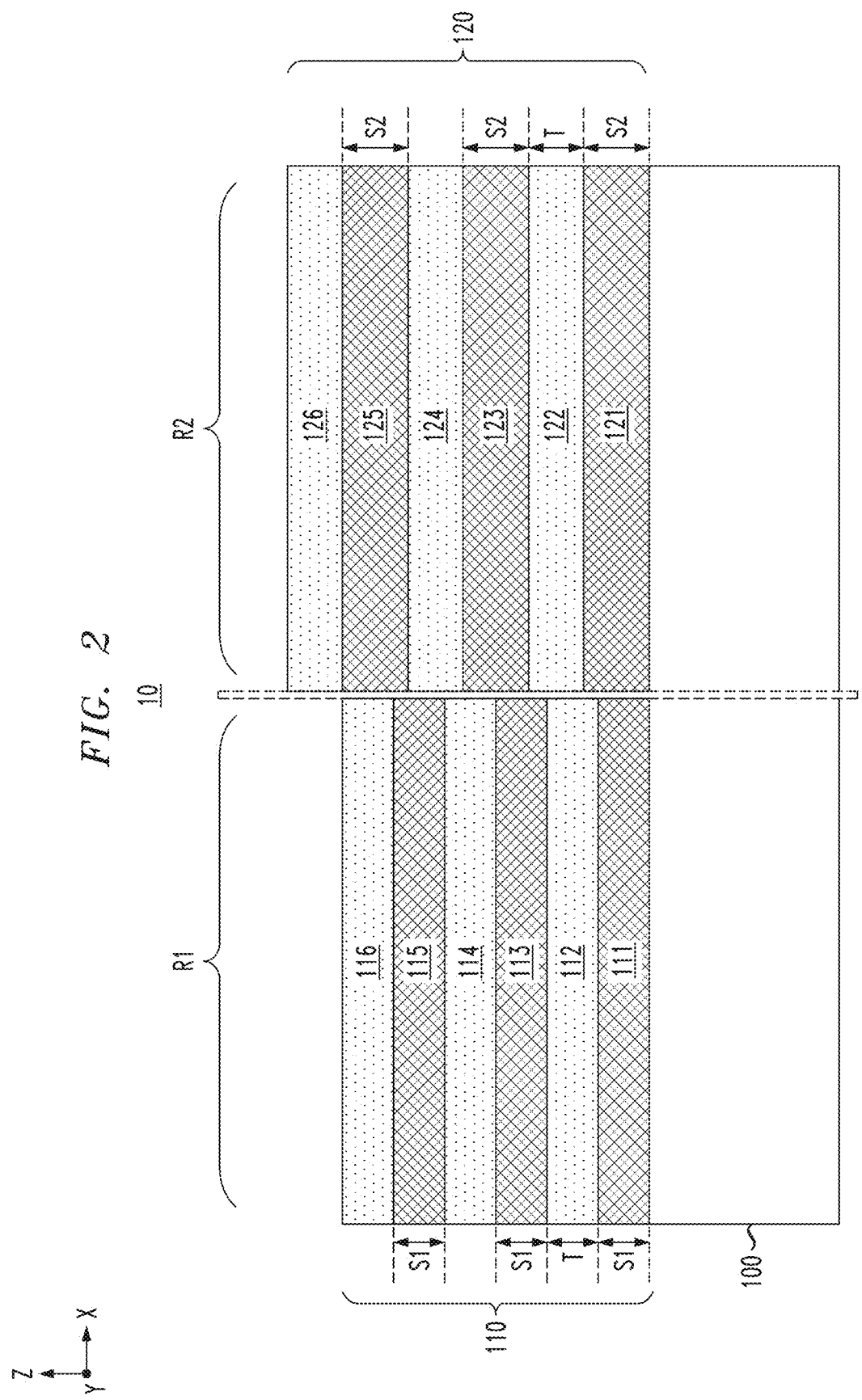

To begin, FIG. 2 is a schematic cross-sectional side view (X-Z plane) of the semiconductor device 10 at initial stage of fabrication comprising a semiconductor substrate 100, a first nanosheet stack structure 110 and a second nanosheet stack structure 120 formed on the semiconductor substrate 100. The first nanosheet stack structure 110 comprises a stack of alternating epitaxial semiconductor layers 111, 112, 113, 114, 115, and 116, which are formed in a first device region R1, and the second nanosheet stack structure 120 comprises a stack of alternating epitaxial semiconductor layers 121, 122, 123, 124, 125, and 126, which are formed in a second device region R2. While the semiconductor substrate 100 is illustrated as a generic substrate layer, it is to be understood that the semiconductor substrate 100 may comprise one of different types of semiconductor substrate structures and materials.

For example, in one embodiment, the semiconductor substrate 100 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 100 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 100 (e.g., wafer) being processed.

The stack of alternating semiconductor layers 111-116 of the first nanosheet stack structure 110 comprises sacrificial nanosheet layers 111, 113, and 115, and active nanosheet channel layers 112, 114, and 116. Each active nanosheet channel layer 112, 114, and 116 is disposed between sacrificial nanosheet layers in the first nanosheet stack structure 110. Similarly, the stack of alternating semiconductor layers 121-126 of the second nanosheet stack structure 120 comprises sacrificial nanosheet layers 121, 123, and 125, and active nanosheet channel layers 122, 124, and 126. Each active nanosheet channel layer 122, 124, and 126 is disposed between sacrificial nanosheet layers in the second nanosheet stack structure 120. The stacks of alternating semiconductor layers 111-116 and 121-126 comprise epitaxial semiconductor layers that are sequentially grown.

For example, in one embodiment, the epitaxial semiconductor layers 111-116 and 121-126 comprise single crystal (monocrystalline) semiconductor materials, which are epitaxially grown using known methods such as chemical vapor deposition (CVD), metal-organic chemical vapor deposition (MOCVD), low pressure chemical vapor deposition (LP-CVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the epitaxial semiconductor layers 111-116 and 121-126 will depend on various factors such as the type of nanosheet FET device (p-type, or n-type), and the desired level of etch selectivity between the semiconductor layers, as well as providing sufficient lattice matching between the materials of the semiconductor layers to ensure proper (e.g., defect-free) epitaxial growth of the crystalline semiconductor layers 111-116.

For example, in one embodiment, the active nanosheet channel layers 112, 114, and 116 of the first nanosheet stack structure 110 and the active nanosheet channel layers 122, 124, and 126 of the second nanosheet stack structure 120 are formed of epitaxial silicon (Si). In this instance, the sacrificial nanosheet layers 111, 113, and 115 of the first nanosheet stack structure 110 and the sacrificial nanosheet layers 121, 123, and 125 of the second nanosheet stack structure 120 are formed of a material, such as an epitaxial silicon-germanium (SiGe) alloy, which can be etched selective to the epitaxial material of the active nanosheet channel layers 112, 114, 116 and 122, 124, 126. This allows the sacrificial nanosheet layers 111, 113, 115, and 121, 123, 125 to be etched selective to the epitaxial Si material of the active nanosheet channel layers 112, 114, 116 and 122, 124, 126 in a subsequent process step to "release" the active nanosheet channel layers.

In other embodiments, the active nanosheet channel layers 112, 114, 116 and 122, 124, 126 can be formed of an epitaxial SiGe material with a desired Ge concentration (optimized for device performance), and the sacrificial nanosheet layers 111, 113, 115 and 121, 123, 125 can be formed of a sacrificial semiconductor material (e.g., Si) that can be etched selective to the active nanosheet channel layers. While the first and second nanosheet stack structures 110 and 120 are shown to include three active nanosheet channel layers 112, 114, 116 and 122, 124, 125, in other embodiments of the invention, the first and second nanosheet stack structures 110 and 120 can be fabricated with more or less than three active nanosheet channel layers.

As shown in the exemplary embodiment of FIG. 2, each of the active nanosheet channel layers 112, 114, 116 and 122, 124, 126 of the first and second nanosheet stack structures 110 and 120 are formed with a same thickness T, which defines a target thickness of the channel layers of the nanosheet FET devices. In addition, the sacrificial nanosheet layers 111, 113, and 115 of the first nanosheet stack structure 110 are formed with a thickness which defines a channel spacing S1 between active channel layers of the nanosheet FET device(s) to be formed in the first device region R1. Further, the sacrificial nanosheet layers 121, 123 and 125 of the second nanosheet stack structure 120 are formed with a thickness which defines a channel spacing S2 between active channel layers of the nanosheet FET device(s) to be formed in the second device region R2.

The thickness T of the active nanosheet channel layers 112, 114, 116 and 122, 124, 126 defines, in part, the threshold voltage of the nanosheet FET devices (e.g., Vt increases with decreasing channel thickness). In one embodiment, the thickness T of the active nanosheet channel layers is in a range of about 6 nm to about 8 nm, although the active nanosheet channel layers can be formed with other thickness ranges, depending on the application. The channel spacings S1 and S2 and the types of WFM materials disposed within the spaces S1 and S2 above and below the active nanosheet channel layers define, in part, the threshold voltages of the nanosheet FET devices. In one embodiment, the channel spacing S1 is in a range of about 5 nm to about 7 nm, and the channel spacing S2 is in a range of about 7 nm to about 9 nm.

As shown in FIG. 1, the first and second nanosheet stack structures 110 and 120 will have different stack heights due to the different thicknesses of the sacrificial nanosheet layers that are needed in the different device regions R1 and R2 to obtain the different channel spacings S1 and S2 for the nanosheet FET devices. In this regard, the first and second nanosheet stack structures 110 and 120 are formed in the different device regions R1 and R2 at different stages of fabrication. For example, the first nanosheet stack structure 110 can be formed by epitaxially growing the layers 111, 112, 113, 114, 115, and 116 over the entire substrate surface, followed by performing a suitable patterning process to remove the portions of the layers 111, 112, 113, 114, 115, and 116 disposed in the device region R2 (and other device regions). Thereafter, the epitaxial layers 121, 122, 123, 124, 125 and 126 of the second nanosheet stack structure 120 can be grown starting on the exposed surface of the substrate 100 in the second device region R1. It is to be understood that while exemplary embodiments as discussed herein are based on the fabrication of two separate nanosheet stack structures to achieve two different channel spacings for nanosheet FET devices, three or more nanosheet different nanosheet stack structures can be fabricated to achieve three or more different channel spacings for fabricating multi-Vt nanosheet devices.

Figure 3:
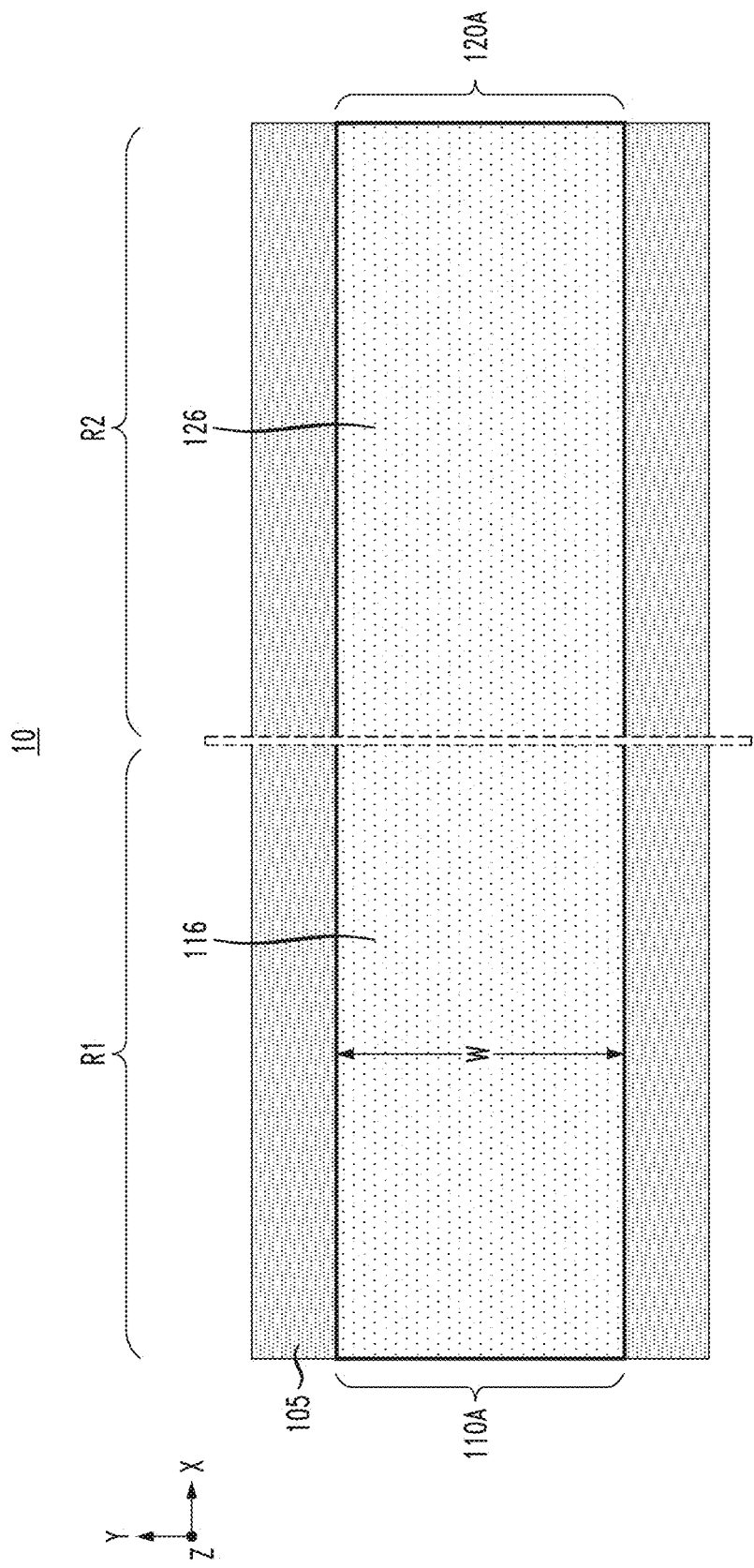

A next phase of the process flow comprises patterning the first and second nanosheet stack structures 110 and 120 to form elongated nanosheet stack structures which define a width W of the active channel layers of the nanosheet FET device D1 and D2, and forming an isolation layer (e.g., shallow trench isolation (STI) layers) in the surface of the semiconductor substrate 100 surrounding the patterned nanosheet stack structures. For example, FIG. 3 is a schematic top plan view (X-Y plane) of the semiconductor device structure of FIG. 2 after patterning the first and second nanosheet stack structures 110 and 120 to form elongated nanosheet stack structures 110A and 120A each having a width W, and after forming an STI layer 105 surrounding the elongated nanosheet stack structures 110A and 120A. This initial patterning process results in the formation of the elongated nanosheet stack structures 110A and 120A having a width W which defines a width W of the nanosheet stack structures 110-1 and 120-1 of the nanosheet FET devices D1 and D2 (i.e., defines the width W of the active nanosheet channel layers 112, 114, and 116 of the nanosheet FET device D1 and the width of the active nanosheet channel layers 122, 124 and 126 of the nanosheet FET device D2). In one embodiment, the width W is larger (e.g., 2× or more) than the thickness T of the active nanosheet channel layers.

In one embodiment, the patterning process is performed by forming an etch mask (e.g., a photoresist mask) having openings which define an image of the STI layer 105, and using the etch mask to etch exposed portions of the nanosheet stack structures 110 and 120 (FIG. 2) down to the surface of the semiconductor substrate 100, and continue etching the substrate 100 to form trenches 110-1 at a depth D below the upper surface of the substrate 100 (see e.g., FIG. 4C). The etch mask can be formed using any suitable patterning process including, but not limited to, a photolithography process, or a multi-patterning process. The etching can be performed using one or more sequential dry etch processes with etch chemistries that are suitable to etch the materials of the semiconductor layers 111-116 and 121-126 of the first and second nanosheet stacks 110 and 120 and the semiconductor substrate 100.

In one embodiment, the STI layer 105 is formed by a process which comprises depositing a layer of insulating material over the surface of the semiconductor device structure to cover the elongated nanosheet structures 110A and 120A, planarizing the surface of the semiconductor device structure (via chemical mechanical polishing (CMP)) down to an upper surface of the thicker elongated nanosheet structure 120A, and then performing an etch-back (or recess) process to recess the remaining layer of insulating material down to a target level which defines a thickness of the STI layer 105. In one embodiment, the STI layer 105 is formed with a thickness D that is substantially equal to the thickness (or depth) of the trenches 100-1 (i.e., coplanar with an upper surface of the semiconductor substrate 100). The STI layer 105 is formed of any type of insulating material, such an oxide material, which is suitable for the given fabrication process flow. The insulating material (e.g., silicon oxide) can be deposited and patterned using known techniques.

Figure 4B:
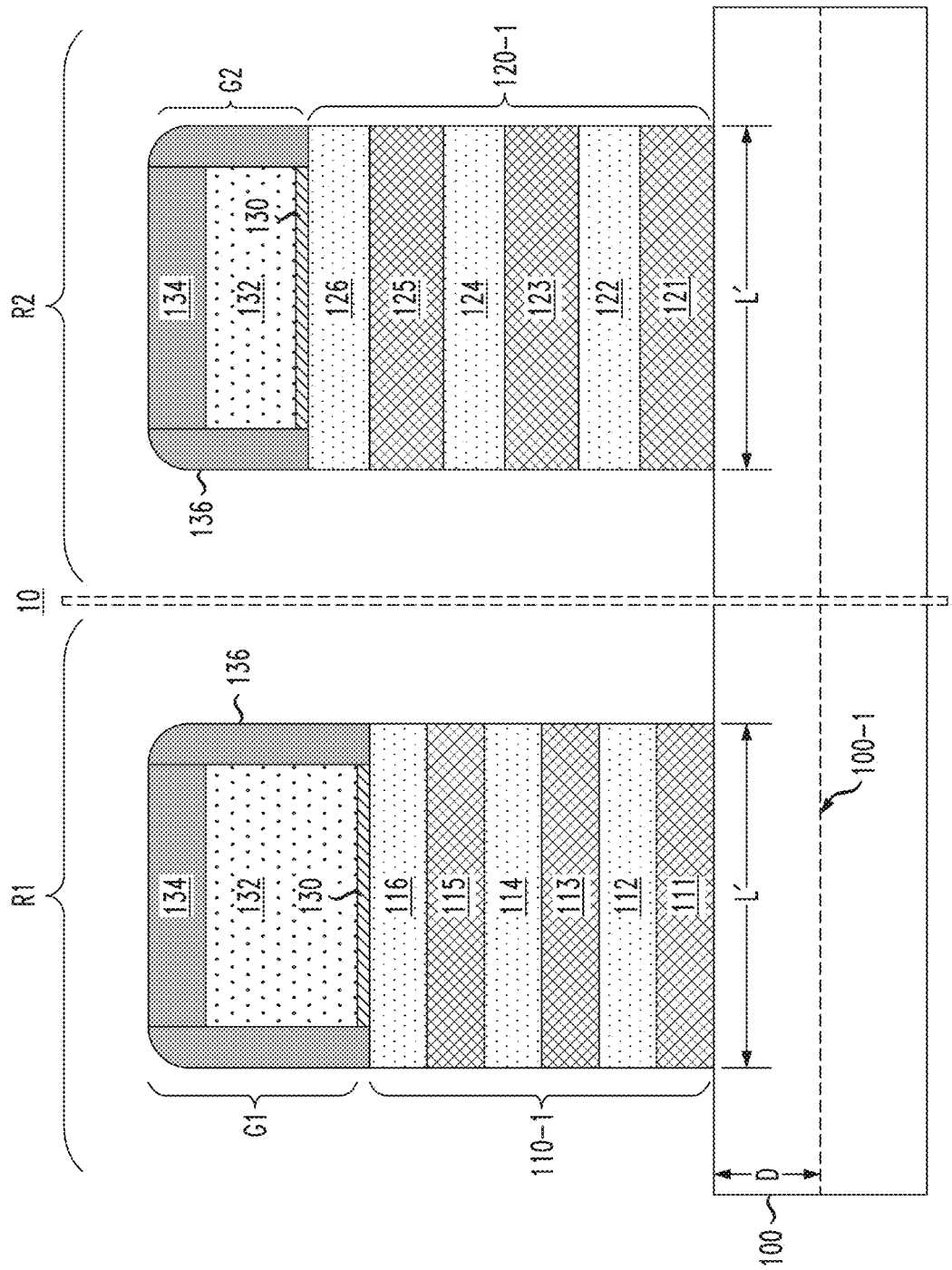
FIG. 4B is a schematic cross-sectional side view of the semiconductor device structure along line 4B-4B shown in FIG. 4A.
Figure 4C:
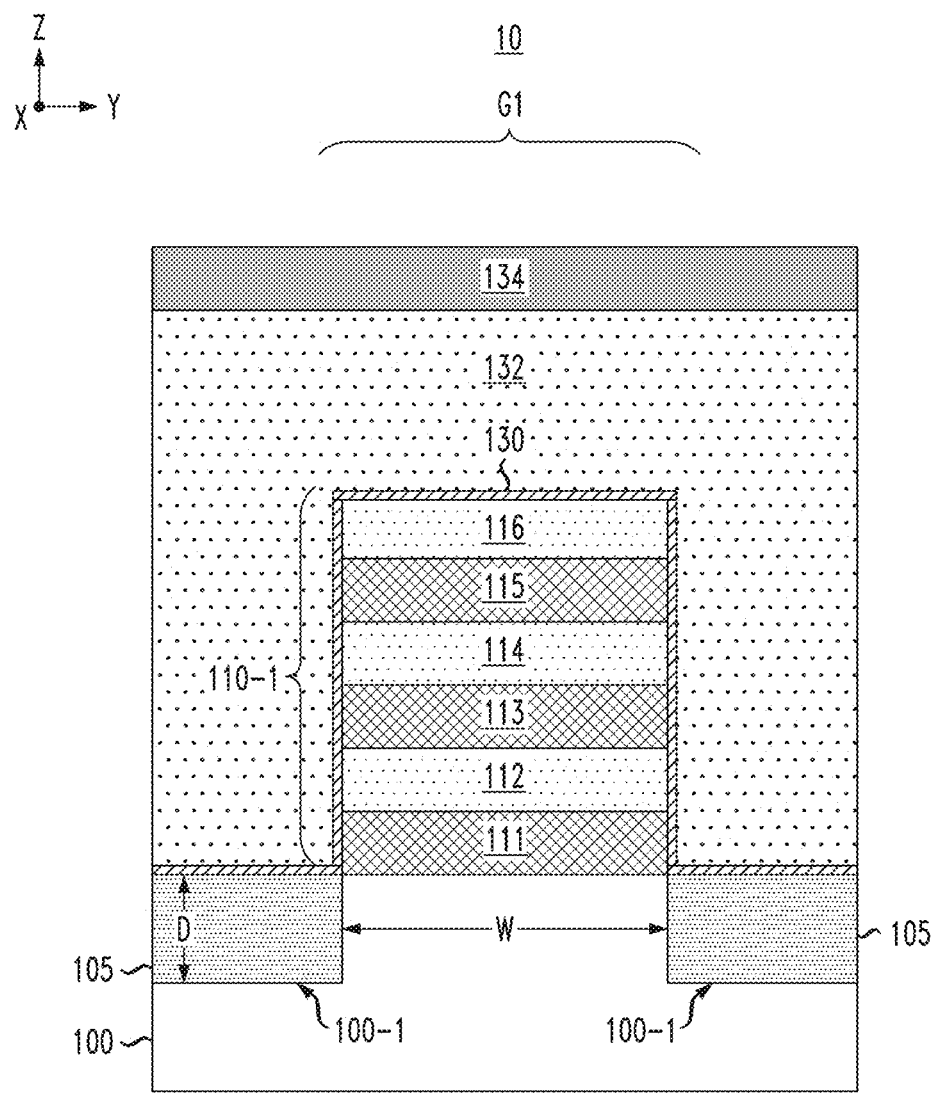
FIG. 4C is a schematic cross-sectional side view of the semiconductor device structure along line 4C-4C shown in FIG. 4A.

Next, FIGS. 4A, 4B, and 4C are schematic views of the semiconductor device structure of FIG. 3 after forming first and second gate structures G1 and G2 over the elongated nanosheet stack structures 110A and 120A, and further patterning the elongated nanosheet stack structures 110A and 120A to form the individual first and second nanosheet stack structures 110-1 and 120-1 for the first and second nanosheet FET devices D1 and D2. FIG. 4A is a schematic top plan view (X-Y plane) of the semiconductor device structure of FIG. 3, FIG. 4B is a schematic cross-sectional side view (X-Z plane) of the semiconductor device structure along line 4B-4B shown in FIG. 4A, and FIG. 4C is a schematic cross-sectional side view (Y-Z plane) of the semiconductor device structure along line 4C-4C shown in FIG. 4A.

As shown in FIGS. 4A, 4B, and 4C, the first and second gate structures G1 and G2 comprise dummy gate structures which each include a dummy gate oxide layer 130, and a dummy gate electrode layer 132 (e.g., sacrificial polysilicon or amorphous silicon material). In addition, the gate structures G1 and G2 include the gate capping layers 134 and gate sidewall spacers 136. The dummy gate oxide layers 130 and the dummy gate electrode layers 132 of the gate structures G1 and G2 comprise sacrificial material which is subsequently removed as part of a replacement metal gate process and replaced with a high-k gate dielectric material and metallic material to form the HKMG gate structures for the nanosheet FET devices. The semiconductor device structure shown in FIGS. 4A, 4B, and 4C is fabricated using known methods.

For example, starting with the semiconductor device structure of FIG. 3, a thin conformal layer of silicon oxide is deposited over the entire surface of the semiconductor device structure covering the upper surface and sidewalls of the elongated nanosheet stack structures 110A and 120A, followed by a blanket deposition of a sacrificial material such as polysilicon or amorphous silicon material over the conformal layer of silicon oxide to cover the elongated nanosheet stack structures 110A and 120A. A chemical mechanical polishing (CMP) process is then performed to planarize the layer of sacrificial material, and a hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers and gate sidewall spacers.

The hard mask layer is then patterned to form the gate capping layers 134, which define an image of the dummy gate structures. The gate capping layers 134 are then utilized as an etch hardmask to anisotropically etch (e.g., RIE) the sacrificial polysilicon and oxide layers to thereby form the dummy gate oxide layers 130 and the dummy gate electrodes 132 of the gate structures G1 and G2. The gate sidewall spacers 136 are then formed by depositing a conformal layer of dielectric material over the entire surface of the semiconductor device structure. The conformal layer of dielectric material can be formed of SiN, SiCN, SiON, BN, SiBN, SiBCN, SiOCN, or any other type of dielectric material that is commonly used to form insulating gate sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the elongated nanosheet stack structures 110A and 120A and the STI layer 105. The etch process results in the formation of the gate sidewall spacers 136, which surround the sidewall surfaces of the dummy gate electrodes 132 and the gate capping layers 134, as shown in FIGS. 4A, 4B, and 4C. The gate sidewall spacers 136 define gate regions of the nanosheet FET devices D1 and D2.

After forming the gate sidewall spacers 136, an anisotropic dry etch process (e.g., RIE) is performed to etch down the exposed portions of the elongated nanosheet stack structures 110A and 120A in source/drain regions adjacent to the gate structures G1 and G2 down to the upper surface of the semiconductor substrate 100 and the STI layer 105. This etch process results in forming the individual nanosheet stack structures 110-1 and 120-1 of the nanosheet FET devices D1 and D2 wherein the individual nanosheet stack structures 110-1 and 120-1 each have a defined length L' in the X-direction (see FIGS. 4A and 4B). The width W in the Y-direction (see FIGS. 4A and 4C) of the resulting nanosheet stack structures 110-1 and 120-1 are maintained since the sidewall surfaces of the nanosheet stack structures 110-1 and 120-1 which define the width W are covered by the dummy gate layers 130 and 132, and the gate sidewall spacers 136 (see, e.g., FIG. 4C).

It is to be understood that FIGS. 4A-4C illustrate an exemplary embodiment in which the gate structures G1 and G2 are shown to overlap one nanosheet stack structure 110-1 and 120-1, respectively. In practice, each gate structure G1 and G2, for example, would be an elongated gate structure that extends in the Y direction to overlap a plurality of elongated nanosheet stack structures which are disposed in parallel to the elongated nanosheet stack structures 110A and 120A (FIG. 3) and commonly patterned from the epitaxial semiconductor nanosheet stacks 110 and 120 (FIG. 2).

Figure 5:
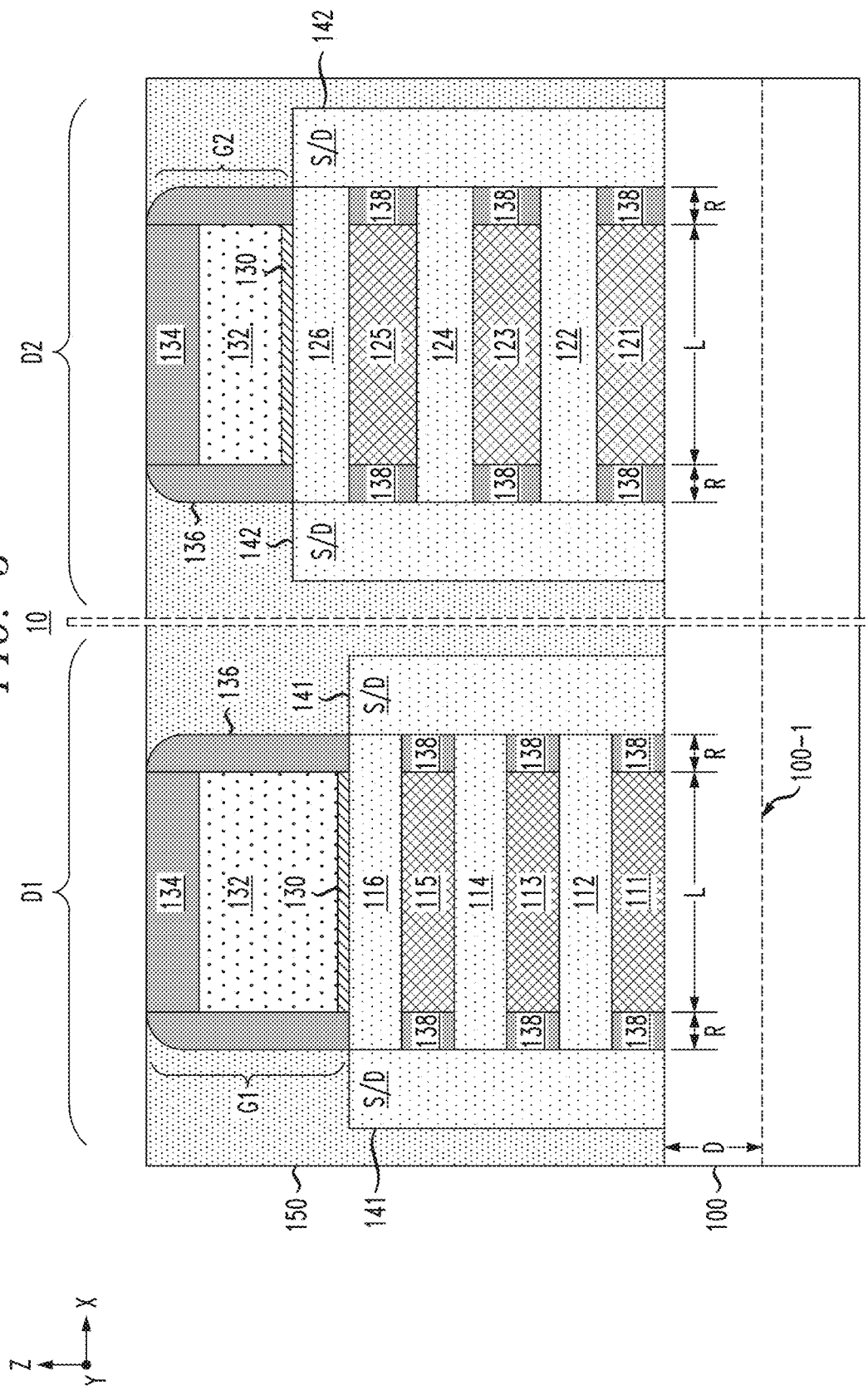

Next, FIG. 5 is a schematic cross-sectional side view of the semiconductor device structure shown in FIG. 4B after forming the inner spacers 138 for the first and second gate structures G1 and G2, after forming the epitaxial source/drain layers 141 and 142 for the first and second nanosheet FET devices D1 and D2, and after forming the ILD layer 150. In one embodiment, the inner spacers 138 are formed by a process which comprises laterally recessing exposed sidewall surfaces of sacrificial nanosheet layers 111, 113, 115 and 121, 123, 125 of the nanosheet stack structures 110-1 and 120-1 to form recesses in the sidewalls of the nanosheet stack structures 110-1 and 120-1. As shown in FIG. 5, the exposed sidewall surfaces of the sacrificial nanosheet layers 111, 113, 115 and 121, 123, 125 of the nanosheet stack structures 110-1 and 120-1 are laterally recessed to a depth R (in the X-direction). The amount of lateral recess R is controlled through a timed etch. In one embodiment, the depth of the recess R is substantially equal to the thickness of the gate sidewall spacers 136.

In one embodiment of the invention, the lateral etch process can be performed using an isotropic wet etch process with an etch solution that is suitable to etch the semiconductor material (e.g., SiGe) of the sacrificial nanosheet layers 111, 113, 115 and 121, 123, 125 of the nanosheet stack structures 110-1 and 120-1 selective to the semiconductor material (e.g., Si) of the active nanosheet channel layers 112, 114, 116 and 122, 124, 126 and other exposed elements. In another embodiment, an isotropic dry plasma etch process can be performed to laterally etch the exposed sidewall surfaces of the sacrificial nanosheet layers selective to the active nanosheet channel layers and other exposed elements.

The recesses are then filled with dielectric material to form the inner spacers 138 (or embedded spacers) on the sidewalls of the nanosheet stack structures 110-1 and 120-1. In one embodiment, the inner spacers 138 are formed by depositing a conformal layer of dielectric material over the semiconductor device structure until the recesses are filled with dielectric material, followed by an etch back to remove the excess dielectric material. In one embodiment, the inner spacers 138 are formed of the same dielectric material used to form the gate sidewall spacers 136. For example, the inner spacers 138 can be formed of SiN, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structures 110-1 and 120-1 and expose the sidewalls of the active nanosheet channel layers 112, 114, 116, 122, 124, 126, while leaving the dielectric material in the recesses to form the inner spacers 138. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Following formation of the inner spacers 138, the source/drain layers 141 and 142 of the nanosheet FET devices D1 and D2 are formed by epitaxially growing semiconductor material (e.g., epitaxial Si material or SiGe material) on the exposed sidewall surfaces of the active nanosheet channel layers 112, 114, 116, 122, 124, 126 using known techniques such as CVD, MOCVD, LPCVD, MBE, VPE, or other known epitaxial growth techniques which are suitable for the given process flow. The type of epitaxial semiconductor material that is used to form the source/drain layers 141 and 142 will vary depending on various factors including, but not limited to, the type of material of the active nanosheet channel layers 112, 114, 116, 122, 124, and 126, the device type (e.g., n-type or p-type) of the nanosheet FET devices D1 and D2, etc.

The epitaxial growth of the semiconductor material on the exposed sidewall surfaces of the active nanosheet channel layers 112, 114, 116, 122, 124 and 126 is performed so that the epitaxial material merges to form (i) the source/drain layers 141 on the vertical sidewalls of the nanosheet stack structure 110-1 and (ii) the source/drain layers 142 on the vertical sidewalls of the nanosheet stack structure 120-1, as schematically shown in FIG. 5. Furthermore, in one embodiment, the source/drain layers 141 and 142 are doped using known techniques. For example, in one embodiment, the source/drain layers 141 and 142 are "in-situ" doped during epitaxial growth by adding a dopant gas to the source deposition gas (i.e., the Si-containing gas). Exemplary dopant gases may include a boron-containing gas such as BH3 for pFETs or a phosphorus or arsenic containing gas such as PH3 or AsH3 for nFETs, wherein the concentration of impurity in the gas phase determines its concentration in the epitaxially grown semiconductor material. Although not specifically shown in FIG. 5, prior to forming the source/drain layers 141 and 142, an isolation layer can be formed on or within a recess of the exposed surface of the substrate 100 to provide isolation between the substrate 100 and the source/drain layers 141 and 142 of the nanosheet FET devices D1 and D2.

In addition, in one embodiment of the invention, a thermal anneal process is performed following the epitaxial growth of the doping of source/drain layers 141 and 142 to cause dopants to be injected into the end portions of the active nanosheet channel layers 112, 114, 116, 122, 124, and 126 that are in contact with the epitaxial semiconductor material of the source/drain layers 141 and 142. This process effectively results in extending the source/drain regions 141 and 142 into the semiconductor material of the end portions of the active nanosheet channel layers 112, 114, 116, 122, 124, and 126 of the nanosheet stack structures 110-1 and 120-1.

Following the formation of the epitaxial source/drain layers 141 and 142, the process flow continues with forming the ILD layer 150 (or pre-metal dielectric (PMD) layer) to encapsulate the dummy gate structures of the nanosheet FET devices D1 and D2 in dielectric/insulating material, prior to commencing a replacement metal gate process. In one embodiment, the ILD layer 150 is formed by depositing a blanket layer of dielectric/insulating material over the semiconductor device structure and planarizing the layer of dielectric/insulating material down to the gate capping layers 134 to form the ILD layer 150, as schematically shown in FIG. 5. The ILD layer 150 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the ILD layer 150 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layers 134. In some embodiments, the ILD layer 150 comprises a silicon nitride liner that is initially formed on the surfaces of dummy gates, the spacers, and the source/drain layers, followed by a blanket deposition of, e.g., silicon oxide.

Following the formation of the ILD layer 150, a replacement metal gate process is performed to replace the sacrificial dummy gate material with a metal gate structure, using a process flow as schematically illustrated in FIG. 6A through FIG. 9. For example, FIGS. 6A, 6B, 6C, and 6D are schematic views of the semiconductor device structure shown in FIG. 5 after removing the gate capping layers 134 and the sacrificial dummy gate material (dummy oxide layers 130 and dummy gate electrode layers 132) of the first and second gate structures G1 and G2 to form first and second open gate regions 155-1 and 155-2, and after removing the sacrificial nanosheet layers 111, 113, 115, 121, 123 and 125 exposed within the open gate regions 155-1 and 155-2 to release the active nanosheet channel layers 112, 114, 116, 122, 124 and 126 of the first and second nanosheet stack structures 110-1 and 120-1. FIG. 6B is a schematic cross-sectional side view (X-Z plane) of the semiconductor device structure along line 6B-6B shown in FIG. 6A. FIG. 6C is a schematic cross-sectional side view (Y-Z plane) of the semiconductor device structure along line 6C-6C shown in FIG. 6A. FIG. 6D is a schematic cross-sectional side view (Y-Z plane) of the semiconductor device structure along line 6D-6D shown in FIG. 6A.

In one embodiment, the dummy gate capping layers 134 can be removed by planarizing (e.g., via CMP) the surface of the semiconductor device structure of FIG. 5 down to the upper surface of the dummy gate electrode layers 132. In another embodiment, the dielectric material of the dummy gate capping layers 134 (e.g., SiN) can be etched away selective to the materials of gate sidewall spacers 136 (e.g., SiBCN) and the ILD layer 150 (e.g., silicon oxide) to expose the underlying dummy gate electrode layers 132. The dummy gate electrode layers 132 (e.g., polysilicon material) are then etched away using known etching techniques and etch chemistries. For example, the sacrificial dummy gate polysilicon material can be removed using a selective dry etch or wet etch process with suitable etch chemistries, including ammonium hydroxide (NH$_4$OH), tetramethylammonium hydroxide (TMAH), or SF6 plasma. The etching of the dummy gate electrode layers 132 is selective to, e.g., the underlying dummy gate oxide layers 130, to thereby protect the semiconductor materials of the nanosheet stack structures 110-1 and 120-1 from being etched during the poly etch process. After removing the sacrificial material of the dummy gate electrode layers 132, an oxide etch process is performed to etch away the dummy gate oxide layers 130 selective to, e.g., the active nanosheet channel layers 112, 114, 116, 122, 124 and 126. In this manner, the sacrificial materials (e.g., dummy polysilicon and oxide layers) of the dummy gates can be etched away without damaging the active nanosheet channel layers.

After removing the dummy gate oxide layers 130, an etch process is performed to selectively etch away the sacrificial nanosheet layers 111, 113, 115, 121, 123, and 125 of the nanosheet stack structures 110-1 and 120-1 to release the active nanosheet channel layers 112, 114, 116, 122, 124, and 126 of the nanosheet stack structures 110-1 and 120-1. This etch process results in the open gate regions 155-1 and 155-2 extending into the open spaces S1 and S2 between and adjacent to the active nanosheet channel layers 112, 114, 116, 122, 124, and 126. In this embodiment, the open gate regions 155-1 and 155-2 include the open spaces within the inner region defined by the gate sidewall spacers 136 and the inner spacers 138.

The sacrificial nanosheet layers 111, 113, 115, 121, 123, and 125 (e.g., SiGe layers) can be etched away selective to the active nanosheet channel layers 112, 114, 116, 122, 124, and 126 using a wet etch process, for example. In one embodiment, the SiGe material of the sacrificial nanosheet layers 111, 113, 115, 121, 123 and 125 can be selectively etched (with high etch selectivity) using a gas phase HCl (hydrochloric acid) or wet etch solution to laterally etch the SiGe material of the sacrificial nanosheet layers selective to the Si material of the active nanosheet channel layers 112, 114, 116, 122, 124, and 126. The gas phase HCl (hydrochloric acid) provides high etch selectivity when, for example, the active nanosheet channel layers 112, 114, 116, 122, 124, and 126 are formed of Si or SiGe with a lower Ge concentration than the SiGe material of the sacrificial nanosheet layers 111, 113, 115, 121, 123, and 125.

A next stage of the fabrication process comprises forming the HKMG structures 160-1 and 160-2 of the first and second nanosheet FET devices D1 and D2. In the exemplary process flow, the first and second nanosheet devices D1 and D2 have common gate structures in that the same work function metals and deposition processes are utilized to concurrently fabricate the HKMG structures 160-1 and 160-2 of the first and second nanosheet devices D1 and D2. At this stage of fabrication, it is assumed that the RMG process for, e.g., fabricating the common HKMG structures 160-3 and 160-4 of the third and fourth nanosheet devices D3 and D4 (e.g., FIG. 1B) is performed separately from the RMG process for fabricating the common HKMG structures 160-1 and 160-2 of the first and second nanosheet devices D1 and D2.

Figure 6A:
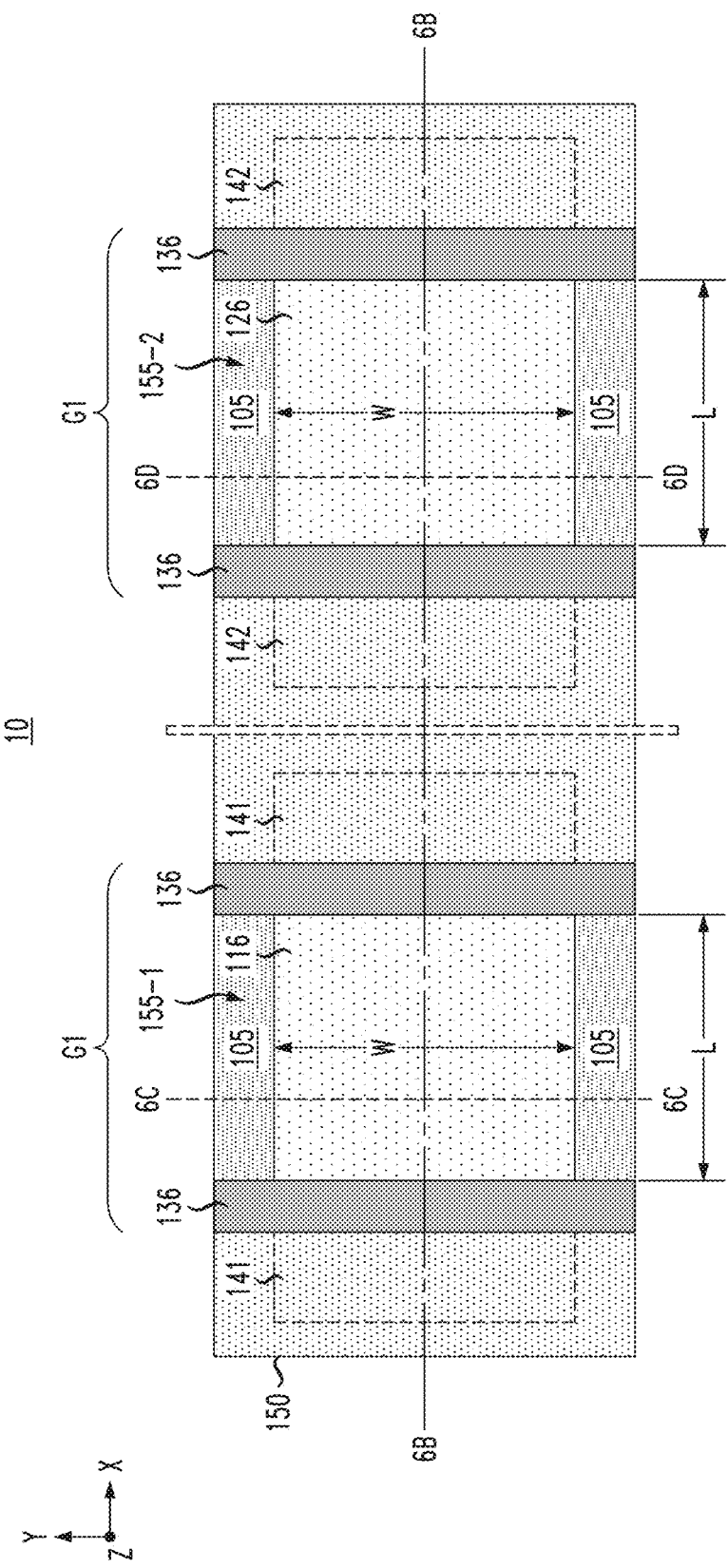
FIG. 6A is a schematic top plan view of the semiconductor device structure shown in FIG. 5 after removing gate capping layers and the sacrificial dummy gate material of the first and second gate structures, and after removing sacrificial nanosheet layers to release active nanosheet channel layers of the first and second nanosheet stack structures.
Figure 6B:
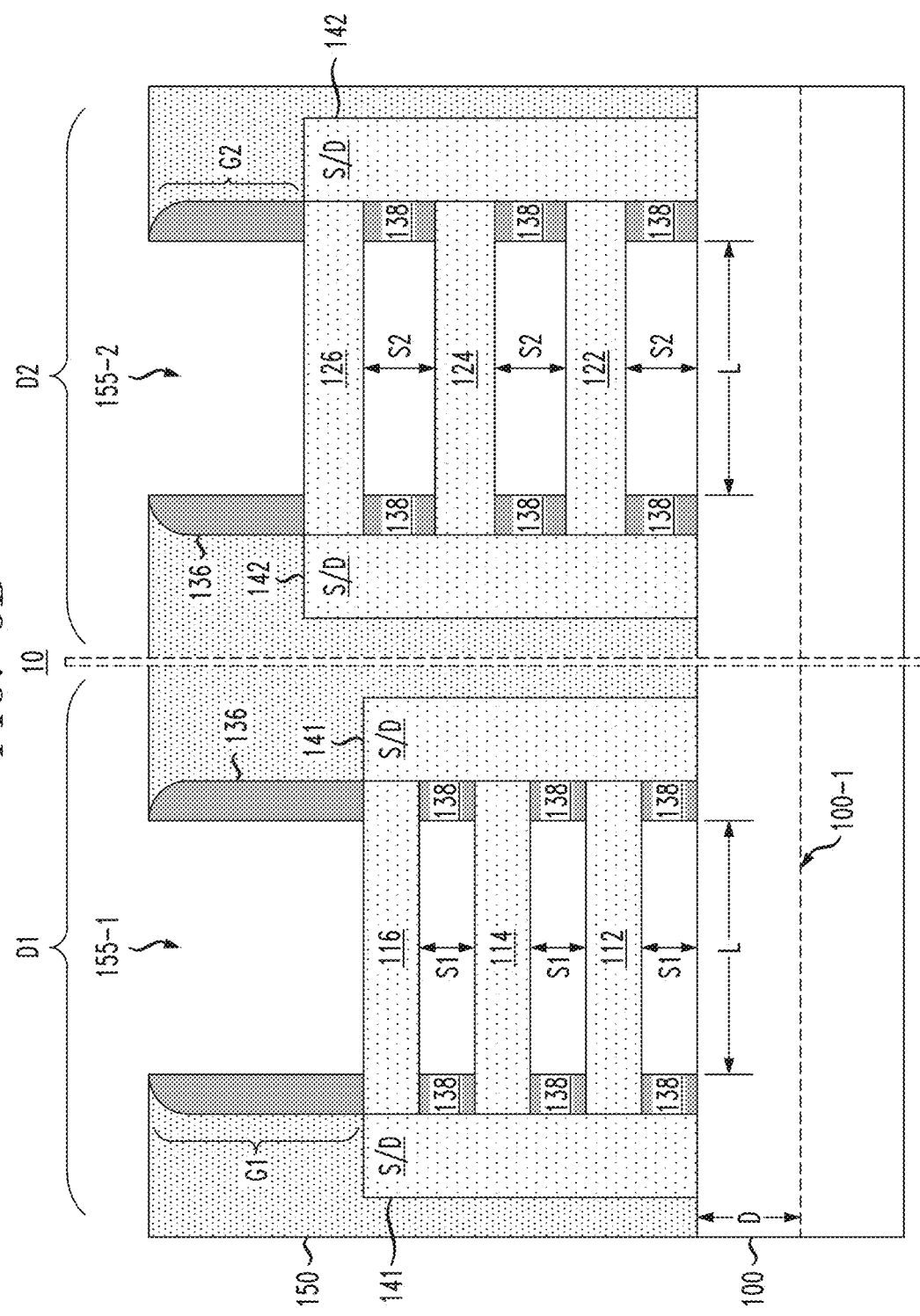
FIG. 6B is a schematic cross-sectional side view of the semiconductor device structure along line 6B-6B shown in FIG. 6A.
Figure 6D:
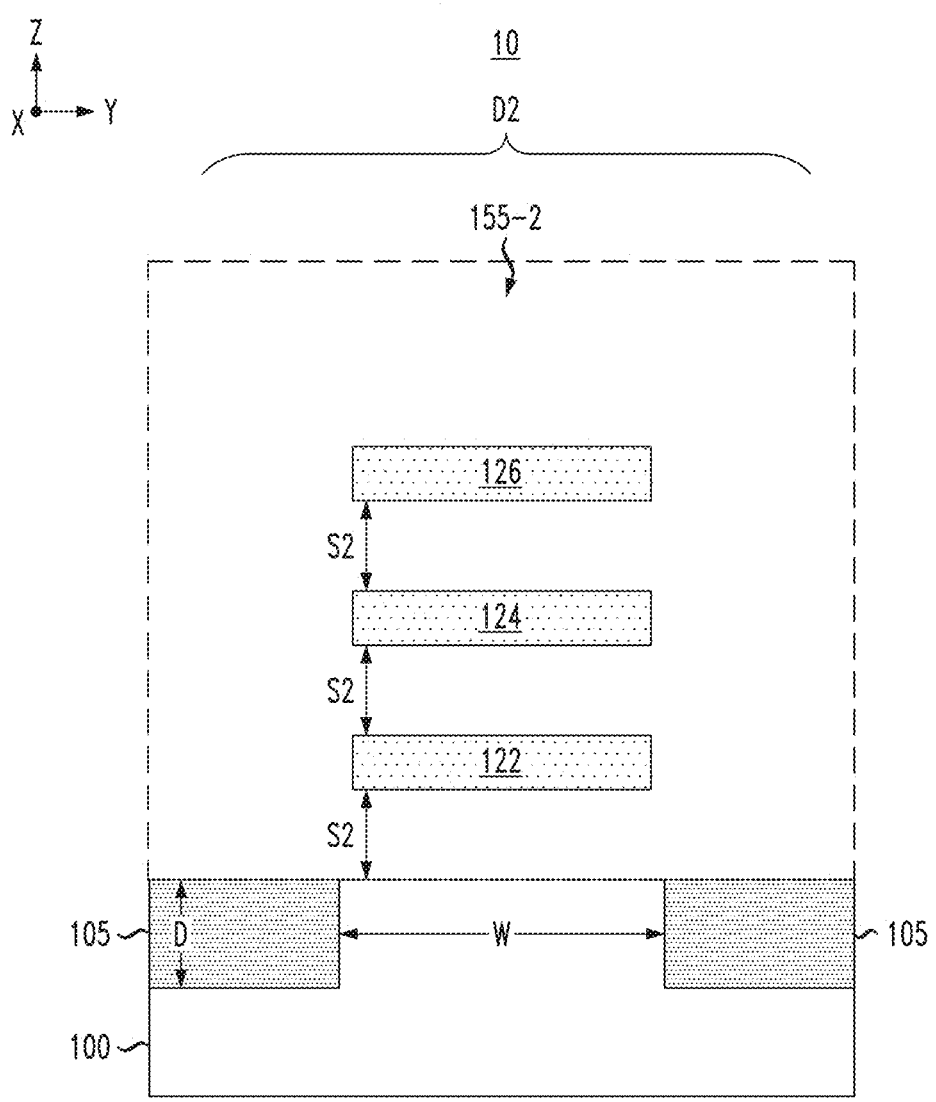
FIG. 6D is a schematic cross-sectional side view of the semiconductor device structure along line 6D-6D shown in FIG. 6A.
Figure 7:
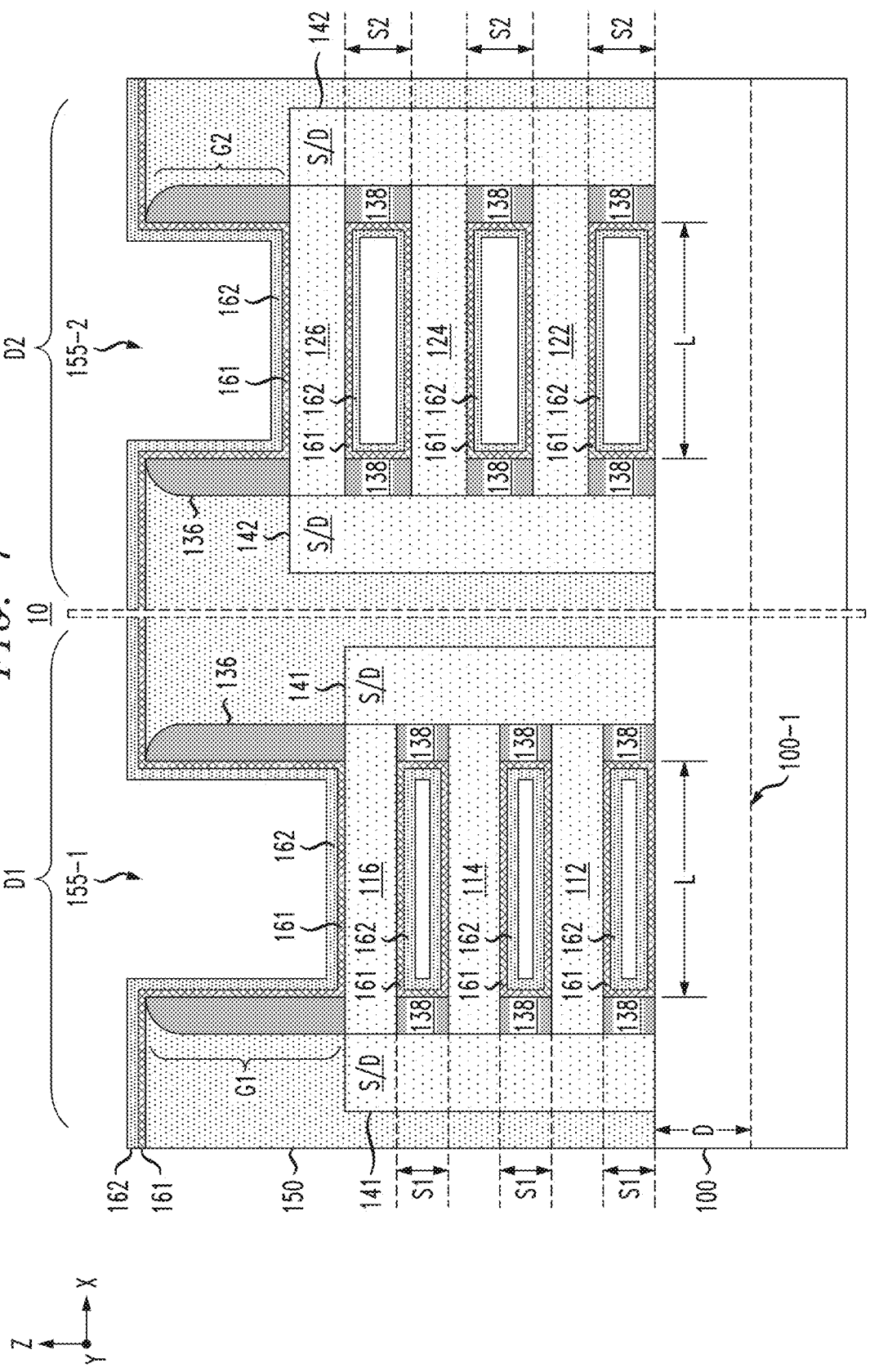

FIG. 7 is a schematic cross-sectional side view of the semiconductor device structure shown in FIG. 6B after forming a high-k gate dielectric layer 161 and a first work function metal layer 162 which conformally covers the exposed silicon surfaces of the active nanosheet channel layers 112, 114, 116, 122, 124 and 126 within the first and second open gate regions 155-1 and 155-2 of the first and second gate structures G1 and G2. In one embodiment, the high-k gate dielectric layer 161 is formed by conformally depositing one or more conformal layers of dielectric material over the exposed surfaces within the open gate regions 155-1 and 155-2 of the semiconductor device structure shown in FIG. 6B, which results in the formation of conformal layer of high-k gate dielectric material on the surfaces of the active nanosheet channel layers 112, 114, 116, 122, 124 and 126 (as well as the bottom and sidewall surfaces of the open gate regions 155-1 and 155-2).

The high-k gate dielectric layers 161 are formed of a high-k dielectric material having a dielectric constant (k) of about 3.9 or greater. For example, the gate dielectric material can include but are not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal gate dielectric layers 161 are formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

In one embodiment, the first work function metal layer 162 comprises a layer of TiN which is formed with a thickness in a range of about 0.5 nm to about 2 nm. In other embodiments, the first work function metal layer 162 may comprise one or more layers of metallic material, including, but not limited to TaN, TiAlC, Zr, W, Hf, Ti, Al, Ru, Pa, TiAl, ZrAl, WAl, TaAl, HfAl, TiAlC, TaC, TiC, TaMgC, or types, compositions, or alloys of work function metals that are commonly used to obtain target work functions which are suitable for the type (e.g., n-type or p-type) of nanosheet FET devices that are to be formed. The first work function metal layer 162 is conformally deposited using known methods such as ALD, CVD, etc., which allow for high conformality of the deposited layer of work function metal.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layers 161, a channel pre-clean process is performed to clean the exposed silicon surfaces of the active nanosheet channel layers 112, 114, 116, 122, 124, and 126, which is then followed by an oxidation process to grow ultra-thin interfacial silicon oxide layers on the exposed surfaces of the active nanosheet channel layers 112, 114, 116, 122, 124, and 126. It is to be understood that the formation of the interfacial silicon oxide layers is an optional step and that in other embodiments of the invention, a high-k dielectric material of the HKMG structures can be formed on the exposed silicon surfaces of the active nanosheet channel layers without initially forming the thin interfacial oxide layers.

In one exemplary embodiment, the interfacial silicon oxide layers are formed using a chemical oxidation process in an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, 116, 122, 124, and 126 to form thin interfacial silicon oxide layers with a thickness in a range of about 5 angstroms to about 10 angstroms (i.e., about 0.5 nm to about 1 nm).

Figure 8A:
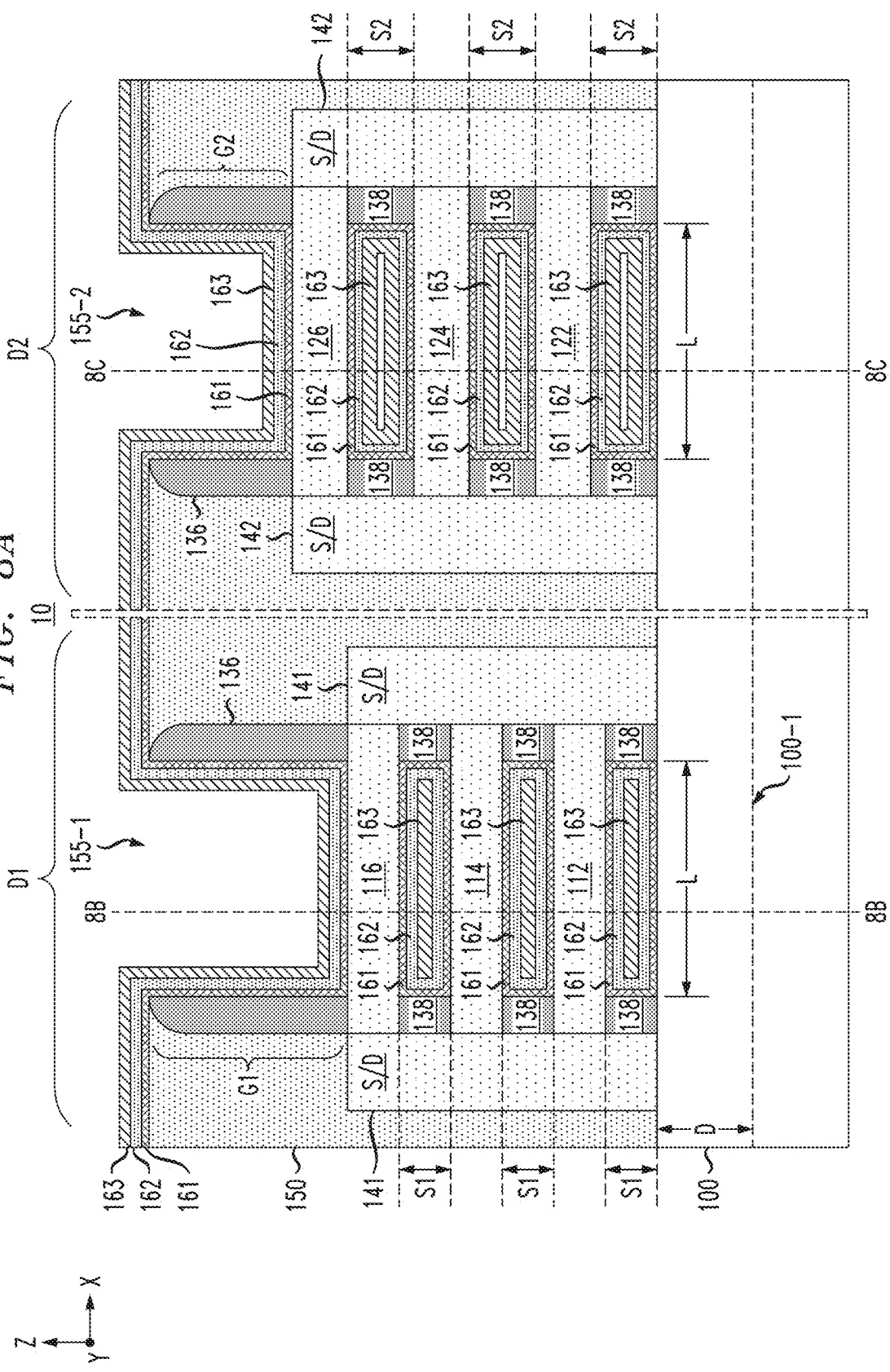
FIG. 8A is a schematic cross-sectional side view of the semiconductor device structure shown in FIG. 7 after forming a second work function metal layer which conformally covers the first work function metal layer within the open gate regions of the first and second gate structures, and which causes "pinch-off" of channel spaces between the active nanosheet channel layers of the first nanosheet FET device.
Figure 8B:
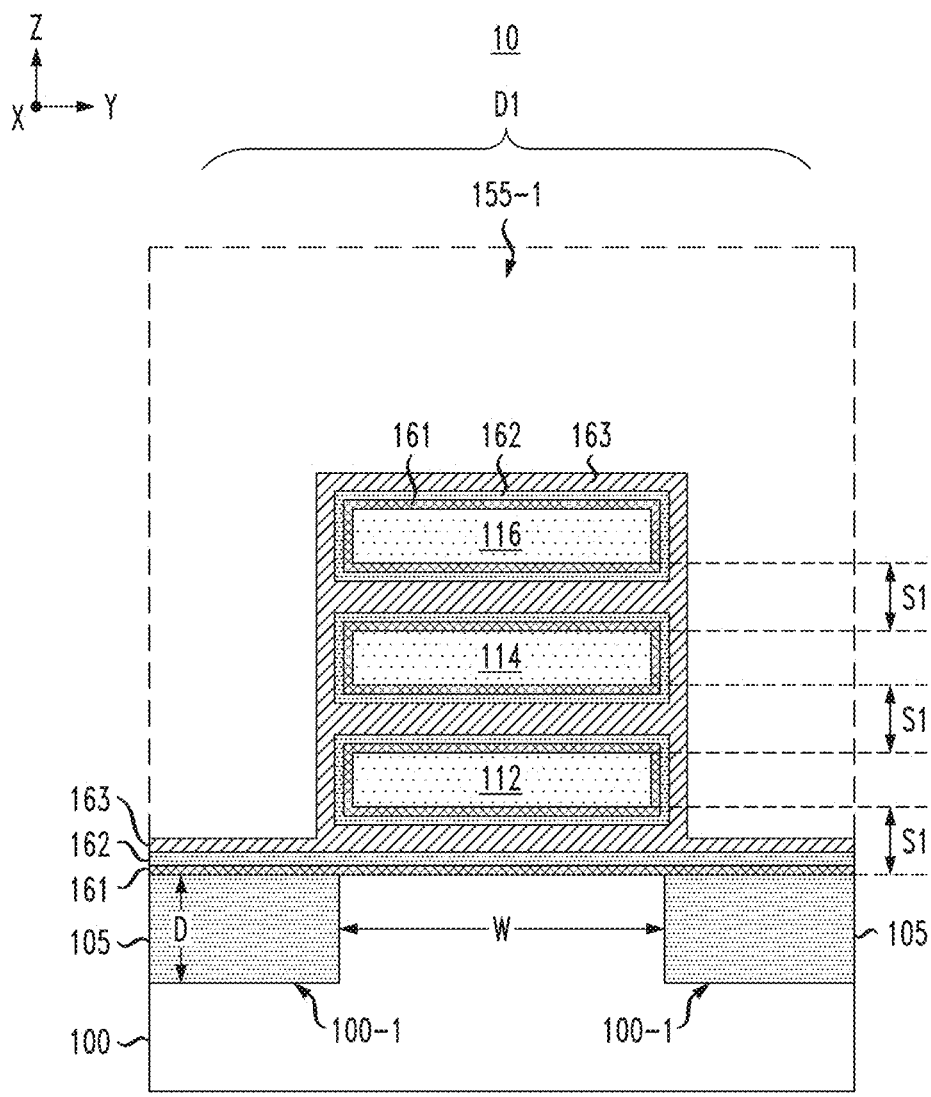
FIG. 8B is a schematic cross-sectional side view of the semiconductor device structure of FIG. 8A along line 8B-8B shown in FIG. 8A.

Next, FIG. 8A is a schematic cross-sectional side view of the semiconductor device structure shown in FIG. 7 after forming a second work function metal layer 163 which conformally covers the first work function metal layer 162 within the first and second open gate regions 155-1 and 155-2 of the first and second gate structures G1 and G2 and which causes "pinch-off" of the reaming portions of the channel spaces S1 between the active nanosheet channel layers 112, 114 and 116 of the first nanosheet FET device D1. FIG. 8B is a schematic cross-sectional side view of the semiconductor device structure of FIG. 8A along line 8B-8B shown in FIG. 8A, and FIG. 8C is a schematic cross-sectional side view of the semiconductor device structure of FIG. 8A along line 8C-8C shown in FIG. 8A.

In one embodiment, the second work function metal layer 163 comprises a layer of metallic material comprising an Al-containing alloy. For example, as noted above, in some embodiments, the second work function metal layer 163 comprises one of TiAlC, TiAl, and AlC, or nitrided alloys thereof. In other embodiments, the second work function metal layer 163 may be a metallic material which comprises a composition or alloy of Zr, W, Hf, Ti, Al, Ru, Pa, ZrAl, WAl, TaAl, HfAl, TaC, TiC, TaMgC, or types, compositions, or alloys of work function metals that are commonly used to obtain target work functions which are suitable for the type (e.g., n-type or p-type) of nanosheet FET devices that are to be formed. The second work function metal layer 163 is deposited using known methods such as ALD, CVD, etc., which allow for high conformality of the deposited layer of work function metal.

Figure 8C:
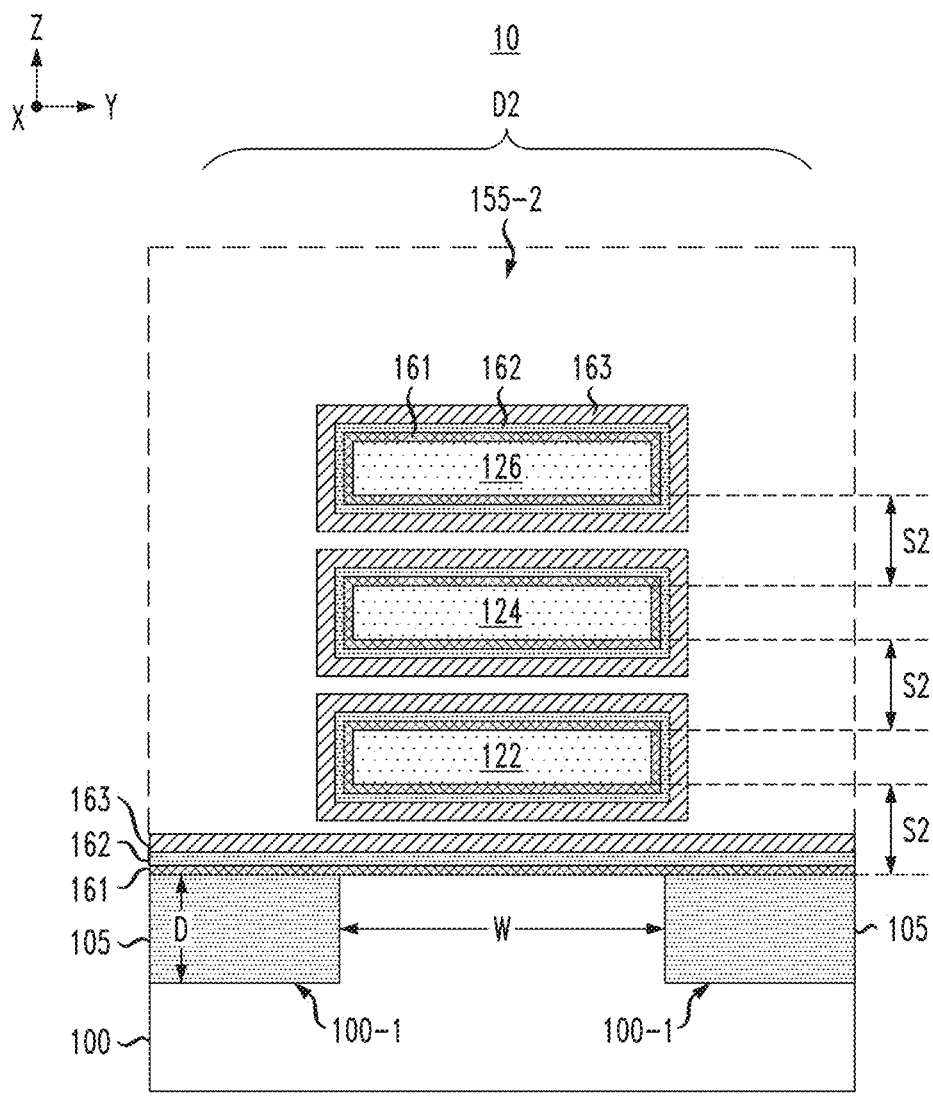
FIG. 8C is a schematic cross-sectional side view of the semiconductor device structure of FIG. 8A along line 8C-8C shown in FIG. 8A.

In one embodiment, the second work function metal layer 163 is deposited with a thickness which is sufficient to completely fill (i.e., pinch off) remaining portions of the channel spaces S1 above and below the active nanosheet channel layers 112, 114, and 116 of the gate structure G1 of the first nanosheet FET device D1 (as shown in FIGS. 8A and 8B), while leaving a thin remaining space in each of the channel spaces S2 between the active nanosheet channel layers 122, 124 and 126 of the gate structure G2 of the second nanosheet FET device D2 (as shown in FIGS. 8A and 8C) to deposit another layer of work function metal. In this embodiment, the resulting HKMG structure 160-1 of the first nanosheet FET device comprises a WFM stack formed of the first and second work function metal layers 162 and 163.

Figure 9:
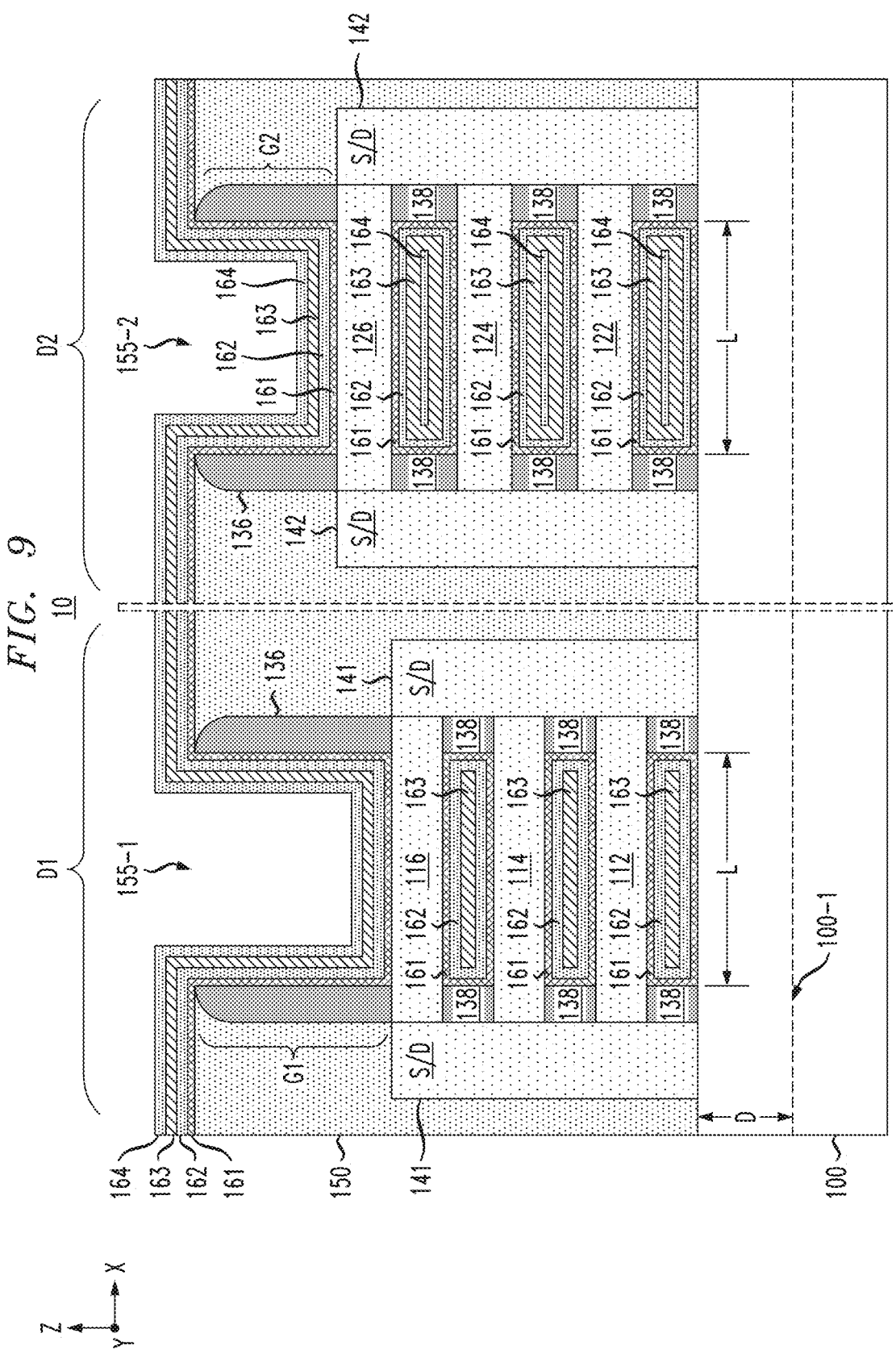

Next, FIG. 9 is a schematic cross-sectional side view of the semiconductor device structure shown in FIG. 8A after forming a third work function metal layer 164 which conformally covers the second work function metal layer 163 within the first and second open gate regions 155-1 and 155-2 of the first and second gate structures G1 and G2 and which fills the remaining portions of the channel spaces S2 between the active nanosheet channel layers 122, 124, and 126 of the first second nanosheet FET device D2. In one embodiment, the third work function metal layer 164 comprises a layer of TiN. The third work function metal layer 164 may be formed of other types, compositions, or alloys of work function metals which are commonly used to obtain target work functions for the type (e.g., n-type or p-type) of nanosheet FET devices that are to be formed. The third work function metal layer 164 is deposited using known methods such as ALD, CVD, etc., which allow for high conformality of the deposited layer of work function metal. In this embodiment, the resulting HKMG structure 160-2 of the second nanosheet FET device D2 comprises a WFM stack formed of the first, second and third work function metal layers 162, 163 and 164.

In another embodiment of the invention, prior to forming the third work function metal layer 164, an oxidation process can be performed to oxidize the second work function metal layer 163. The oxidation of the second work function metal layer 163 is effective to reduce the threshold voltage of nanosheet FET devices (e.g., p-type devices) in which there is no pinch-off of the channel spaces (e.g., channel spaces S2) after the deposition of the second work function metal layer 163.

In the resulting structure shown in FIG. 9, the remaining portions of the open gate regions 155-1 and 155-2 above the active nanosheet channel layers 116 and 126 can be filled with the metallic material of the third work function metal layer 164 by continuing the deposition process until the open gate regions 155-1 and 155-2 above the active nanosheet channel layers 116 and 126 are completely filled with the work function metal layer 164. In another embodiment, the remaining portions of the open gate regions 155-1 and 155-2 above the active nanosheet channel layers 116 and 126 can be filled with a low-resistance metallic material such as tungsten, ruthenium, cobalt, copper, aluminum, etc. to form the metallic gate electrodes 165 of the HKMG structures 160-1 and 160-2 as shown in FIG. 1A. In one embodiment, a liner layer (e.g., seed layer and/or diffusion barrier layer) is deposited to line the exposed bottom and sidewall surfaces of the open gate regions 155-1 and 155-2 prior to depositing the low-resistance metallic material.

Following the deposition of the dielectric and metallic materials that form the HKMG structures 160-1 and 160-2, a CMP process is performed to polish the surface of the semiconductor structure down to the ILD layer 150, thereby removing overburden portions of the gate dielectric, work function, and gate electrode layers, resulting in the semiconductor structure shown in FIG. 1A. Following the formation of the semiconductor structure shown in FIGS. 1A-1D, any known sequence of processing steps can be performed to complete the fabrication of the semiconductor integrated circuit device, the details of which are not needed to understand embodiments of the invention. Briefly, following the formation of the HKMG structures, an etch process can be performed to recess an upper surface of the HKMG structures down to a target level below the upper surface of the ILD layer 150. A layer of dielectric material is then deposited over the surface of the semiconductor device structure to fill the area above the recessed surfaces of the HKMG structure with dielectric material, and the semiconductor device structure is planarized down to the surface of the ILD layer 150 to remove the overburden dielectric material, and thereby form gate capping layers. The gate capping layers can be formed of a dielectric material such as SiN or SiBCN, etc. Next, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

In other embodiments of the invention, different channel spacings of nanosheet FET devices can be achieved by performing channel thinning during an RMG module to increase the spacing between active nanosheet channel layers. For example, FIG. 10 schematically illustrates a channel thinning process which can be performed to adjust a channel spacing between first and second nanosheet FET devices D1 and D2 having the same initial nanosheet stack structure, but wherein channel thinning is applied to the second nanosheet FET device D2 during a RMG process to thin the active nanosheet channel layers 112, 114 and 116, and achieve an increase in the channel spacing from an initial channel spacing S1 to a larger channel spacing S1'.

In particular, prior to forming the optional interfacial silicon oxide layers as discussed above, a silicon thinning process can be performed on the active nanosheet channel layers 112, 114 and 116 of the second nanosheet FET device D2 to decrease a thickness of the exposed portions the active nanosheet channel layers 112, 114, and 116 within the open gate region of the second gate structure G2. For example, in one embodiment, the thickness of the active nanosheet channel layers 112, 114, and 116 can be decreased about 1 nm or less by recessing the upper and bottom surfaces of the exposed active nanosheet channel layers 112, 114, 116 by about 0.5 nm or less.

Figure 10:
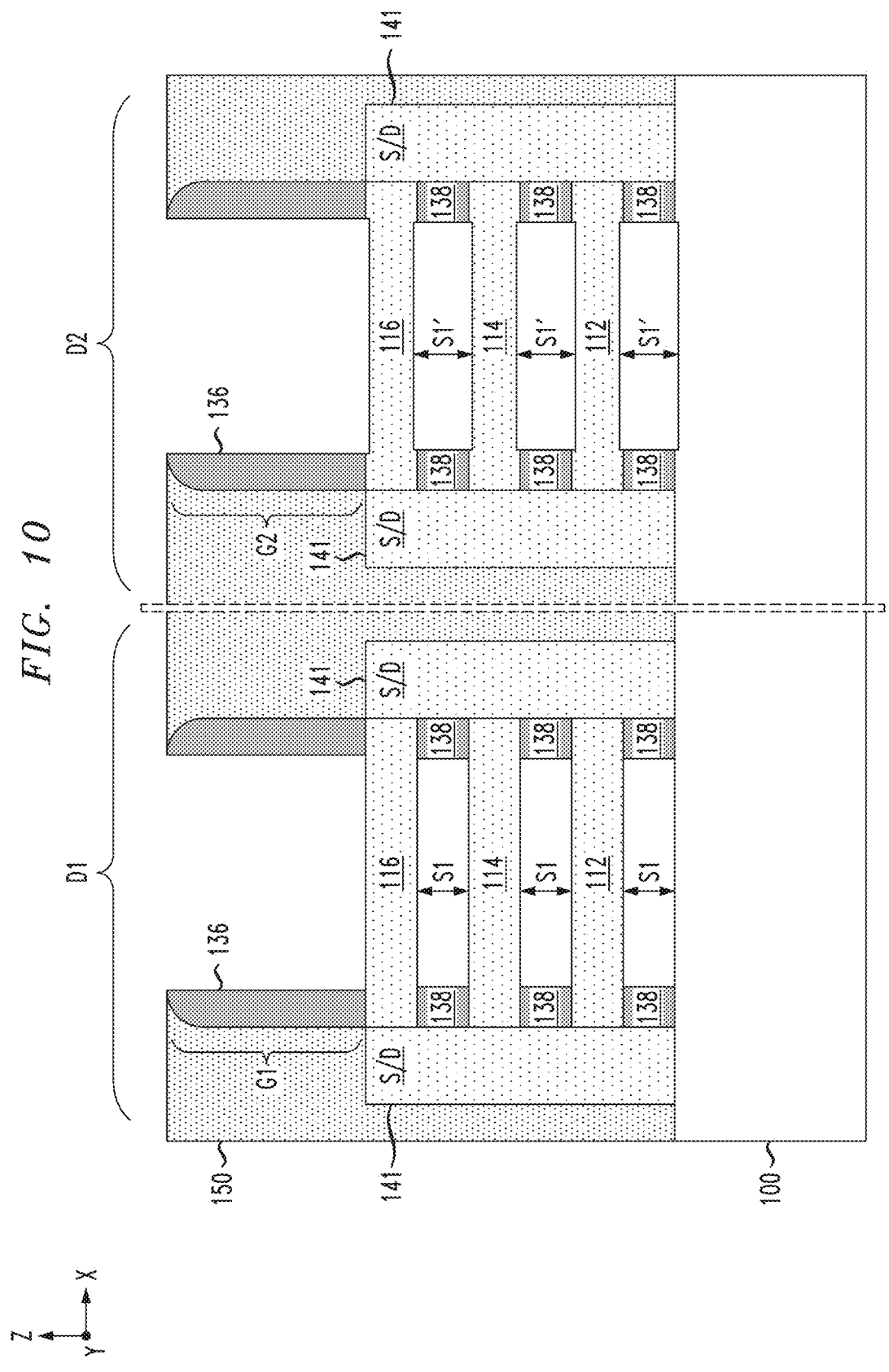
FIG. 10 schematically illustrates a channel thinning process which can be performed during a replacement metal gate process to adjust a channel spacing between first and second nanosheet FET devices.

In one embodiment of the invention, the exposed surfaces of the active nanosheet channel layers 112, 114, and 116 within the open gate region of the gate structure G2 are etched using a process comprising (i) oxidizing the exposed silicon surfaces to form a thin oxide layer on the exposed silicon surfaces, and (ii) removing (via etching) the thin oxide layers to form the thinned active nanosheet channel layers 112, 114, and 116 of the second nanosheet FET device D2 as shown in FIG. 10. In one embodiment, the oxidation process is performed using a low-temperature plasma-assisted oxidation process, with an oxygen plasma stream generated using known techniques and other precursors (inert gases) such as nitrogen or argon. The thin oxide layers are removed using known etching chemistries and techniques. In another embodiment, the silicon thinning process can be performed using an in-situ diluted HCl etch process, in which the amount of silicon material etched away is controlled by a timed etch. In another embodiment, the silicon thinning process can be implemented using a wet oxidation process following and wet etch process, using known etching solutions and techniques.

It is to be understood that the methods discussed herein for fabricating nanosheet FET devices can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:

forming a first field-effect transistor device on a semiconductor substrate, wherein the first field-effect transistor device comprises (i) a plurality of first active channel layers that are separated by a first channel spacing and (ii) a first gate sidewall spacer which defines a first gate region of the first field-effect transistor device;

forming a second field-effect transistor device on the semiconductor substrate, wherein the second field-effect transistor device comprises (i) a plurality of second active channel layers that are separated by a second channel spacing, wherein the second channel spacing is greater than the first channel spacing, and (ii) a second gate sidewall spacer which defines a second gate region of the second field-effect transistor device; and concurrently forming a first high-k dielectric/metal gate structure and a second high-k dielectric/metal gate structure within the first gate region and the second gate region, respectively;

wherein the first field-effect transistor device has a first threshold voltage as a result of the first high-k dielectric/metal gate structure formed around the first active channel layers that are separated by the first channel spacing; and wherein the second field-effect transistor device has a second threshold voltage, which is different from the first threshold voltage, as a result of the second high-k dielectric/metal gate structure formed around the second active channel layers that are separated by the second channel spacing.

2. The method of claim 1, wherein concurrently forming the first high-k dielectric/metal gate structure and the second high-k dielectric/metal gate structure within the first gate region and the second gate region, respectively, comprises:
conformally depositing a high-k dielectric material on exposed surfaces of the first and second active channel layers within the first and second gate regions to form high-k gate dielectric layers around the first and second active channel layers within the first and second gate regions;
conformally depositing a first metallic material on the high-k gate dielectric layers within the first and second gate regions to form first work function metal layers around the first and second active channel layers within the first and second gate regions; and
conformally depositing a second metallic material on the first work function metal layers to form second work function metal layers around the first and second active channel layers in the first and second gate regions;
wherein conformally depositing the second metallic material causes (i) pinch-off of spaces between the first active channel layers that are separated by the first channel spacing and (ii) pinch-off of spaces between the second active channel layers that are separated by the second channel spacing;
wherein a thickness of the second work function metal layers between the first active channel layers is less than a thickness of the second work function metal layers between the second active channel layers, as a result of the pinch-off of the spaces between the first and second active channel layers by the conformal deposition of the second metallic material.

3. The method of claim 2, further comprising performing a chemical oxidation process to oxidize surfaces of the first and second active channel layers within the first and second gate regions to form interfacial oxide layers on the surfaces of the first and second active channel layers, prior to conformally depositing the high-k dielectric material to form the high-k gate dielectric layers.

4. The method of claim 2, wherein the high-k dielectric material comprises one of hafnium oxide, hafnium silicon oxide, hafnium silicon oxynitride, hafnium zirconium oxide, and nitride films thereof.

5. The method of claim 2, wherein the first metallic material comprises titanium nitride and wherein the second metallic material comprises an aluminum-containing alloy.

6. The method of claim 5, wherein the aluminum-containing alloy comprises one of titanium aluminum carbide, titanium aluminum, and aluminum carbide.

7. The method of claim 2, wherein concurrently forming the first high-k dielectric/metal gate structure and the second high-k dielectric/metal gate structure within the first gate region and the second gate region, respectively, further comprises depositing a third metallic material within the first and second gate regions to form first and second gate electrode layers within the first and second gate regions, respectively, wherein the third metallic material comprises one of tungsten, ruthenium, cobalt, copper, and aluminum.

8. The method of claim 1, wherein concurrently forming the first high-k dielectric/metal gate structure and the second high-k dielectric/metal gate structure within the first gate region and the second gate region, respectively, comprises:
conformally depositing a high-k dielectric material on exposed surfaces of the first and second active channel layers within the first and second gate regions to form high-k gate dielectric layers around the first and second active channel layers within the first and second gate regions;
conformally depositing a first metallic material on the high-k gate dielectric layers within the first and second gate regions to form first work function metal layers around the first and second active channel layers within the first and second gate regions; and
conformally depositing a second metallic material on the first work function metal layers to form second work function metal layers around the first and second active channel layers in the first and second gate regions, wherein conformally depositing the second metallic material causes pinch-off of spaces between the first active channel layers that are separated by the first channel spacing within the first gate region;
conformally depositing a third metallic material to form third work function metal layers around the second active channel layers in the second gate region, wherein conformally depositing the third metallic material causes pinch-off of spaces between the second active channel layers that are separated by the second channel spacing within the second gate region.

9. The method of claim 8, further comprising performing a chemical oxidation process to oxidize surfaces of the first and second active channel layers within the first and second gate regions to form interfacial oxide layers on the surfaces of the first and second active channel layers, prior to conformally depositing the high-k dielectric material to form the high-k gate dielectric layers.

10. The method of claim 8, wherein the high-k dielectric material comprises one of hafnium oxide, hafnium silicon oxide, hafnium silicon oxynitride, hafnium zirconium oxide, and nitride films thereof.

11. The method of claim 8, wherein the first and third metallic materials comprise titanium nitride, wherein the second metallic material comprises an aluminum-containing alloy.

12. The method of claim 11, wherein the aluminum-containing alloy comprises one of titanium aluminum carbide, titanium aluminum, and aluminum carbide.

13. The method of claim 8, further comprising performing an oxidation process to oxidize the third work function metal layers in the spaces between the second active channel layers in the second gate region, prior to conformally depositing the third metallic material.

14. The method of claim 1, wherein the first and second field-effect transistor devices comprises nanosheet field-effect transistor devices.

15. A method for fabricating a semiconductor device, comprising:

forming a first nanosheet stack structure of a first nanosheet field-effect transistor device on a semiconductor substrate, wherein the first nanosheet stack structure comprises a first stack of alternating semiconductor layers which comprises a plurality of first sacrificial nanosheet layers, and plurality of first active nanosheet channel layers, wherein each first active nanosheet channel layer is disposed between first sacrificial nanosheet layers in the first nanosheet stack structure, and wherein each first sacrificial nanosheet layer has a first thickness which defines a first channel spacing between the first active nanosheet channel layers of the first nanosheet stack structure;

forming a second nanosheet stack structure of a second nanosheet field-effect transistor device on the semiconductor substrate, wherein the second nanosheet stack structure comprises a second stack of alternating semiconductor layers which comprises a plurality of second sacrificial nanosheet layers, and a plurality of second active nanosheet channel layers, wherein each second active nanosheet channel layer is disposed between second sacrificial nanosheet layers in the second nanosheet stack structure, and wherein each second sacrificial nanosheet layer has a second thickness which defines a second channel spacing between the second active nanosheet channel layers of the second nanosheet stack structure, wherein the second channel spacing is greater than the first channel spacing;

forming first and second dummy gates over the first and second nanosheet stack structures, respectively, to define respective first and second gate regions;

removing the first and second dummy gates to open the first and second gate regions and expose portions of the first and second nanosheet stack structures within the first and second gate regions;

removing the first and second sacrificial nanosheet layers exposed in the first and second gate regions to release the first and second active nanosheet channel layers of the first and second nanosheet stack structures and form spaces between the first active nanosheet channel layers with the first channel spacing and form spaces between the second active nanosheet channel layers with the second channel spacing; and concurrently forming a first high-k dielectric/metal gate structure and a second high-k dielectric/metal gate structure within the first gate region and the second gate region, respectively;

wherein the first nanosheet field-effect transistor device has a first threshold voltage as a result of the first high-k dielectric/metal gate structure formed around the first active channel layers that are separated by the first channel spacing; and wherein the second nanosheet field-effect transistor device has a second threshold voltage, which is different from the first threshold voltage, as a result of the second high-k dielectric/metal gate structure formed around the second active channel layers that are separated by the second channel spacing.

16. The method of claim 15, wherein concurrently forming the first high-k dielectric/metal gate structure and the second high-k dielectric/metal gate structure within the first gate region and the second gate region, respectively, comprises:

conformally depositing a high-k dielectric material on exposed surfaces of the first and second active channel layers within the first and second gate regions to form high-k gate dielectric layers around the first and second active channel layers within the first and second gate regions;

conformally depositing a first metallic material on the high-k gate dielectric layers within the first and second gate regions to form first work function metal layers around the first and second active channel layers within the first and second gate regions; and conformally depositing a second metallic material on the first work function metal layers to form second work function metal layers around the first and second active channel layers in the first and second gate regions;

wherein conformally depositing the second metallic material causes (i) pinch-off of spaces between the first active channel layers that are separated by the first channel spacing and (ii) pinch-off of spaces between the second active channel layers that are separated by the second channel spacing;

wherein a thickness of the second work function metal layers between the first active channel layers is less than a thickness of the second work function metal layers between the second active channel layers, as a result of the pinch-off of the spaces between the first and second active channel layers by the conformal deposition of the second metallic material.

17. The method of claim 15, wherein concurrently forming the first high-k dielectric/metal gate structure and the second high-k dielectric/metal gate structure within the first gate region and the second gate region, respectively, comprises:

conformally depositing a high-k dielectric material on exposed surfaces of the first and second active channel layers within the first and second gate regions to form high-k gate dielectric layers around the first and second active channel layers within the first and second gate regions;

conformally depositing a first metallic material on the high-k gate dielectric layers within the first and second gate regions to form first work function metal layers around the first and second active channel layers within the first and second gate regions; and conformally depositing a second metallic material on the first work function metal layers to form second work function metal layers around the first and second active channel layers in the first and second gate regions, wherein conformally depositing the second metallic material causes pinch-off of spaces between the first active channel layers that are separated by the first channel spacing within the first gate region;

conformally depositing a third metallic material to form third work function metal layers around the second active channel layers in the second gate region, wherein conformally depositing the third metallic material causes pinch-off of spaces between the second active channel layers that are separated by the second channel spacing within the second gate region.

18. A semiconductor integrated circuit device, comprising:
a first field-effect transistor device disposed on a semiconductor substrate, wherein the first field-effect transistor device comprises (i) a plurality of first active channel layers that are separated by a first channel spacing and (ii) a first gate sidewall spacer which defines a first gate region of the first field-effect transistor device;
a second field-effect transistor device disposed on the semiconductor substrate, wherein the second field-effect transistor device comprises (i) a plurality of second active channel layers that are separated by a second channel spacing, wherein the second channel spacing is greater than the first channel spacing, and (ii) a second gate sidewall spacer which defines a second gate region of the second field-effect transistor device; and
common first and second high-k dielectric/metal gate structures disposed within the first and second gate regions, respectively, of the first and second field-effect transistor devices;
wherein the first field-effect transistor device has a first threshold voltage as a result of the first high-k dielectric/metal gate structure formed around the first active channel layers that are separated by the first channel spacing; and
wherein the second field-effect transistor device has a second threshold voltage, which is different from the first threshold voltage, as a result of the second high-k dielectric/metal gate structure formed around the second active channel layers that are separated by the second channel spacing.

19. The semiconductor integrated circuit device of claim 18, wherein the common first and second high-k dielectric/metal gate structures comprise:
high-k gate dielectric layers disposed around the first and second active channel layers within the first and second gate regions, wherein the high-k gate dielectric layers comprise a common gate dielectric material;
first work function metal layers disposed around the first and second active channel layers within the first and second gate regions, wherein the first work function metal layers comprise a common first metallic material; and
second work function metal layers disposed around the first work function metal layers and the first and second active channel layers in the first and second gate regions, wherein the second work function metal layers comprise a common second metallic material;
wherein the second work function metal layers (i) pinch-off of spaces between the first active channel layers that are separated by the first channel spacing and (ii) pinch-off of spaces between the second active channel layers that are separated by the second channel spacing;
wherein a thickness of the second work function metal layers between the first active channel layers is less than a thickness of the second work function metal layers between the second active channel layers.

20. The semiconductor integrated circuit device of claim 18, wherein the common first and second high-k dielectric/metal gate structures comprise:
high-k gate dielectric layers disposed around the first and second active channel layers within the first and second gate regions, wherein the high-k gate dielectric layers comprise a common gate dielectric material;
first work function metal layers disposed around the first and second active channel layers within the first and second gate regions, wherein the first work function metal layers comprise a common first metallic material;
second work function metal layers disposed around the first work function metal layers and the first and second active channel layers in the first and second gate regions, wherein the second work function metal layers comprise a common second metallic material, wherein the second work function metal layers pinch-off of spaces between the first active channel layers that are separated by the first channel spacing within the first gate region;
third work function metal layers disposed around the second active channel layers in the second gate region and disposed is spaces adjacent to sidewalls of the first active channel layers in the first gate region, wherein the third work function metal layers comprises a common third metallic material, wherein the third work function metal layers pinch-off of spaces between the second active channel layers that are separated by the second channel spacing within the second gate region.

* * * * *